(12) United States Patent
Smith et al.

(10) Patent No.: US 6,827,092 B1
(45) Date of Patent: Dec. 7, 2004

(54) WAFER BACKSIDE PLATE FOR USE IN A SPIN, RINSE, AND DRY MODULE AND METHODS FOR MAKING AND IMPLEMENTING THE SAME

(75) Inventors: Stephen M. Smith, Morgan Hill, CA (US); Randolph E. Treur, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 49 days.

(21) Appl. No.: 09/747,660

(22) Filed: Dec. 22, 2000

(51) Int. Cl.[7] .................................................. B08B 3/00
(52) U.S. Cl. ........................... 134/149; 134/32; 134/48; 134/33; 134/147; 134/153; 15/302; 34/58; 34/317
(58) Field of Search ................................ 134/147, 149, 134/32, 33, 48, 153; 15/302; 34/58, 317

(56) References Cited

U.S. PATENT DOCUMENTS

| | | | |
|---|---|---|---|
| 4,313,266 A | | 2/1982 | Tam ................................. 34/8 |
| 4,651,440 A | | 3/1987 | Karl ............................... 34/58 |
| 4,654,522 A | * | 3/1987 | Gornick et al. ........ 250/231.18 |
| 4,788,994 A | * | 12/1988 | Shinbara ...................... 134/157 |
| 5,851,041 A | * | 12/1998 | Anderson et al. ........... 294/106 |
| 5,974,681 A | * | 11/1999 | Gonzalez-Martin et al. ... 34/58 |
| 6,292,972 B1 | * | 9/2001 | Ishihara et al. ................. 15/77 |

FOREIGN PATENT DOCUMENTS

JP        2-138737        5/1990        ......... H01L/21/304

OTHER PUBLICATIONS

A. Higginson and K. Stokes, "*Disk Support for Spin Drying*", Nov. 1975, vol. 18, No. 6, IBM Technical Disclosure Bulletin.

\* cited by examiner

*Primary Examiner*—Alexander Markoff
*Assistant Examiner*—Gentle E. Winter
(74) *Attorney, Agent, or Firm*—Martine & Penilla, LLP

(57) ABSTRACT

An apparatus for preparing a wafer is provided. The apparatus includes a wafer backside plate and a central shaft. The wafer backside plate has a top surface that includes a cylindrical edge lip, which defines a central aperture. The central shaft is designed to fit within the central aperture. The wafer backside plate is designed to automatically slide between an up position during rotational wager processing and a down position when the wafer is not in rotational wafer processing. A gap defined between the top surface of the wafer backside plate and the wafer is less when the wafer backside plate is in the up position than when the wafer backside plate is in the down position.

11 Claims, 15 Drawing Sheets

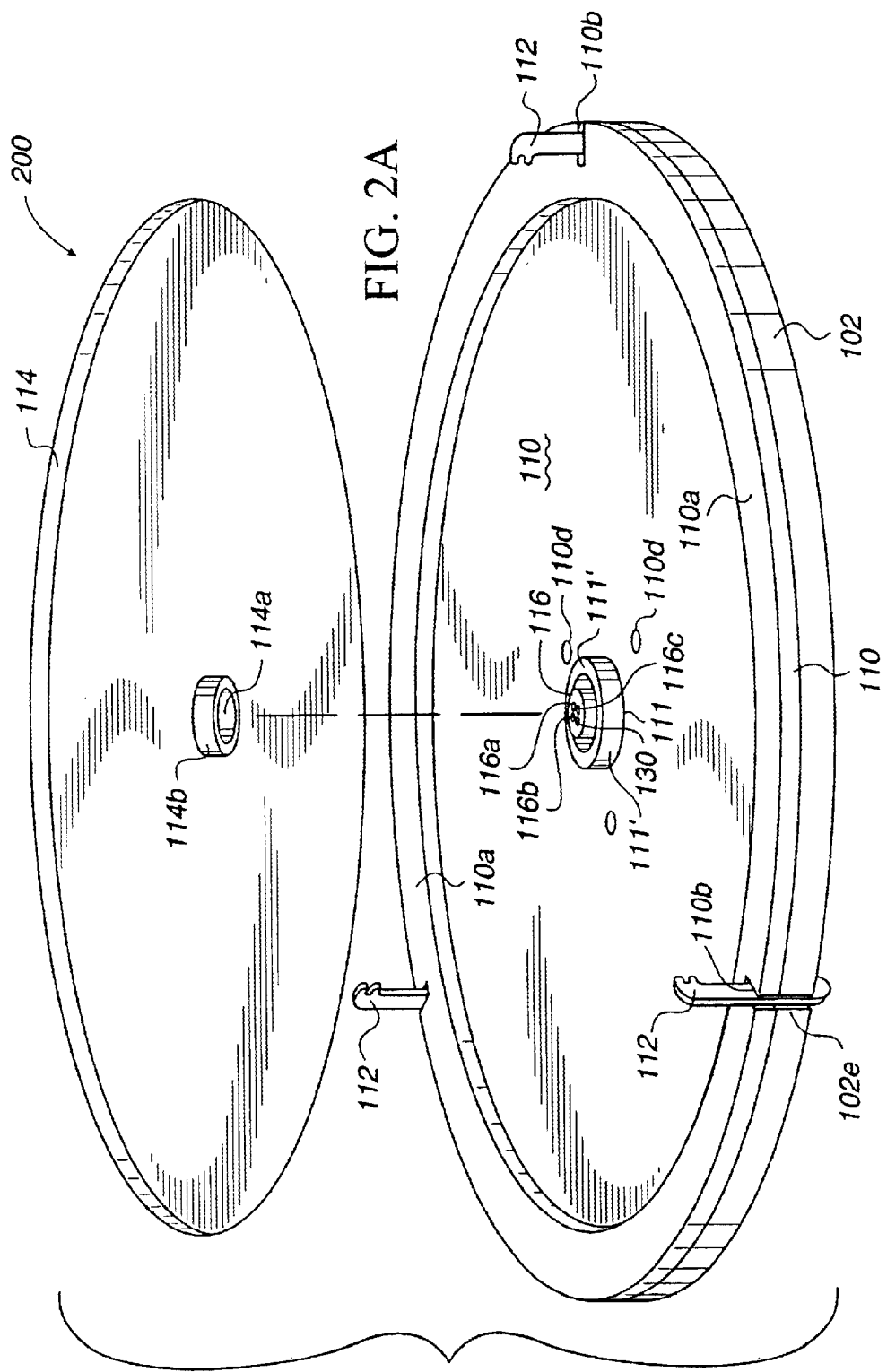

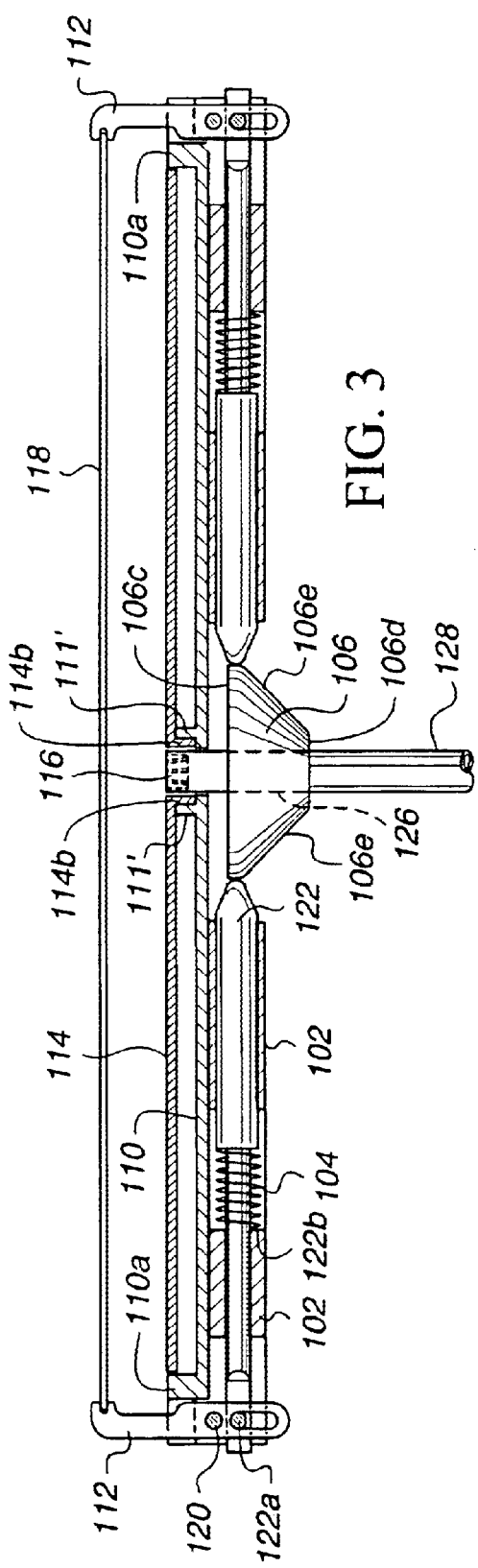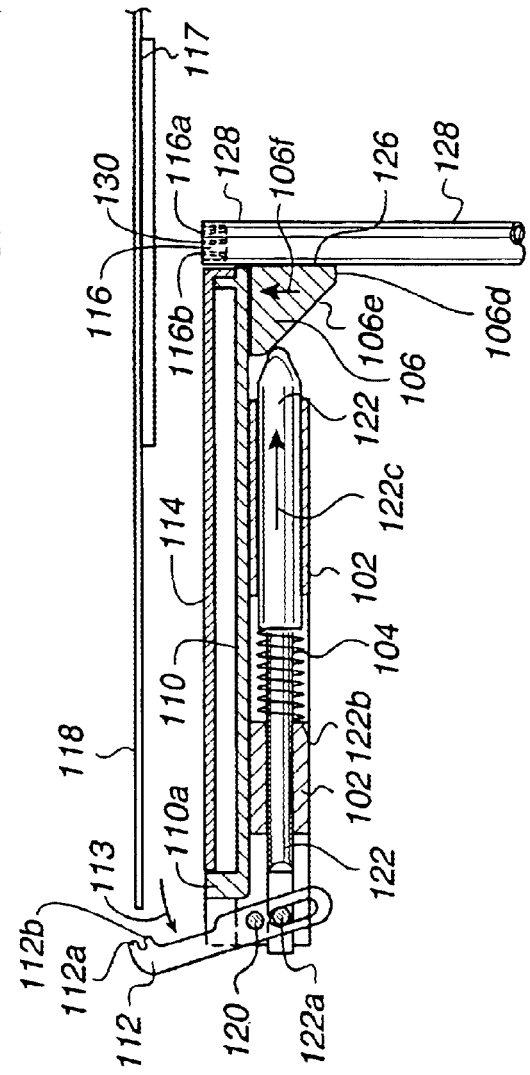

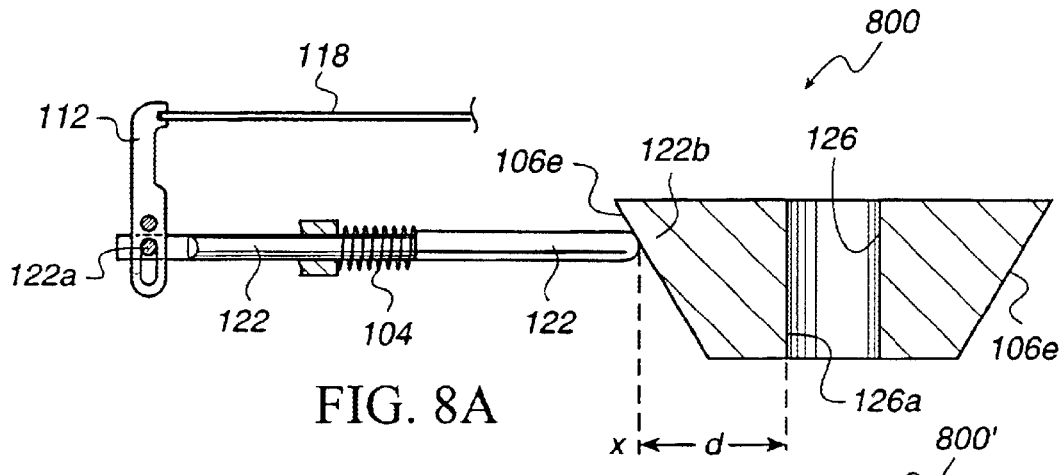
FIG. 8A
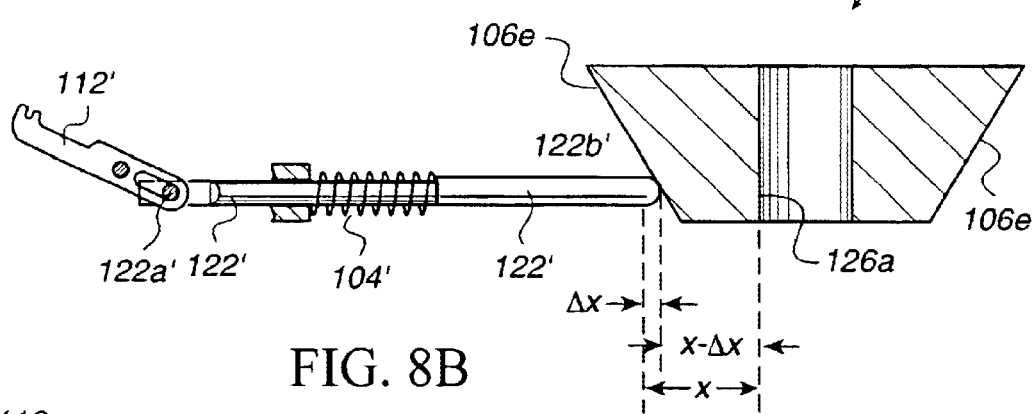
FIG. 8B
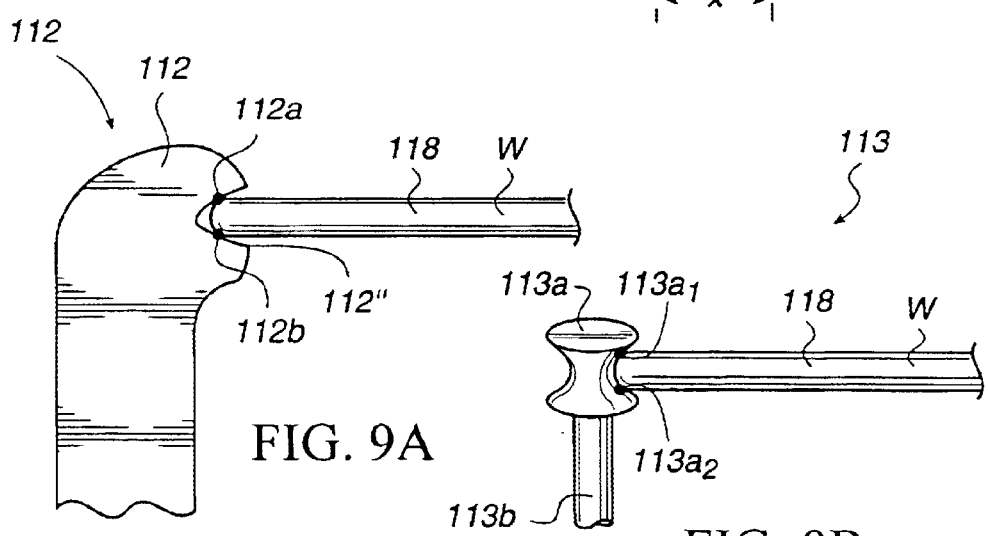
FIG. 9A
FIG. 9B

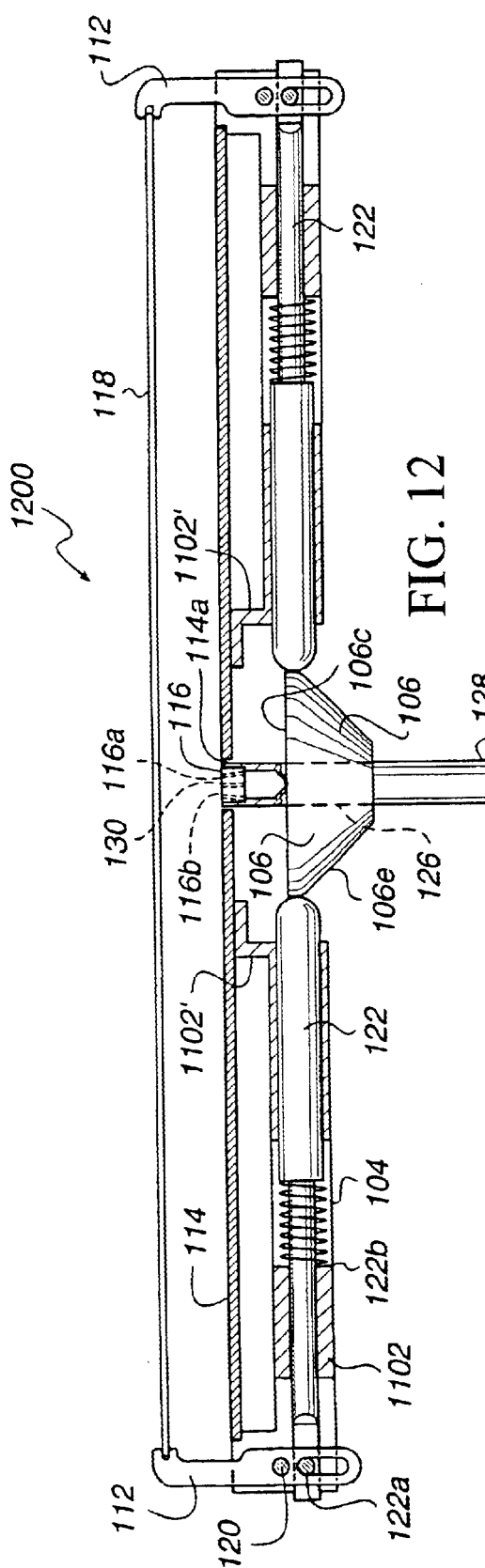
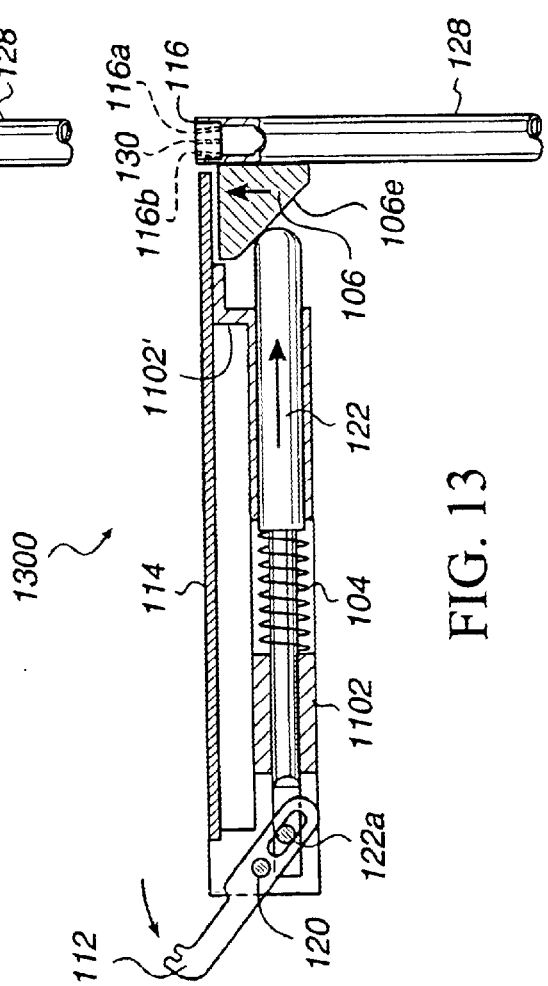
FIG. 12
FIG. 13

US 6,827,092 B1

WAFER BACKSIDE PLATE FOR USE IN A SPIN, RINSE, AND DRY MODULE AND METHODS FOR MAKING AND IMPLEMENTING THE SAME

CROSS REFERENCE TO RELATED APPLICATIONS

This application is related to U.S. patent application Ser. No. 09/747,665, filed on the same day as the instant application and entitled "Chuck Assembly for Use in a Spin, Rinse, and Dry Module and Methods for Making and Implementing the Same."

BACKGROUND OF THE INVENTION

1. Field of the Invention

The present invention relates generally to semiconductor wafer cleaning and, more particularly, a chuck assembly and a wafer backside plate to be used in semiconductor substrate spin, rinse, and dry (SRD) modules.

2. Description of the Related Art

Wafer preparation and cleaning operations are performed in the fabrication of semiconductor devices. One commonly used wager preparation operation used at various stages of substrate perparation is a spin, rinse, and dry (SRD) module. Conventionally, the wafer is spin rinsed by spraying deionezed water onto the top and backside of the wafer, as the wafer is spun around at high speed. The spin rinse operations are typically performed in a bowl rigidly mounted on an SRD housing designed to receive a spindle coupled to a motor. As the motor rotates, so do the spindle, a chuck mounted on the spindle, and the wafer. Customarily, the chuck supports the edges of the wafer by utilizing four spindle fingers coupled to the chuck. The spindle fingers are designed to move upwardly out of the bowl such that they extends outside the bowl housing. Thus, customarily, the wafer is delivered to the spindle fingers while they are extended out side of the bowl at a level above wafer processing plane. Once the wafer is delivered to the spindle fingers, the chuck having the spindle fingers and wafer attached thereto moves back down and into the bowl so as to place the wafer at the level of wafer processing plane.

Typically, fluid (e.g., DI water) is supplied to a spigot and thus onto the surface of the wafer, as the wafer is spun at high revolutions per minute (RPMs). When the surface of the wafer is sprayed with fluid, the supplying of fluid is stopped by turning off the spigot, and the wafer is dried as the wafer continues to spin at high RPMs. Once the wafer is dried, the processed wafer is unloaded by moving the chuck and spindle fingers holding the wafer upwardly out of the bowl until the wafer is extended above the wafer process plane for a second time. At this time, an end effector can reach in and remove the wafer from the SRD module.

Numerous shortcomings can be associated with chuck assemblies of conventional SRD modules. Primarily, the typical SRD module requires a complex chuck design. For instance, the chuck is commonly required to move up and down. The chuck moves up to receive the wafer, moves down to process the wafer and then up again to remove the wafer from the SRD bowl. In view of this continual movement activity, it is imperative that the chuck remains properly calibrated so that it comes to rest at the exact process level. In situations where the chuck is not properly aligned, failure to properly receive and deliver the wafer mandates the realignment of the chuck. The process of realigning of the chuck is very time consuming and labor intensive, and it requires that the SRD module be taken off-line for an extended period of time, thus reducing throughput.

Another shortcoming of conventional chucks is the unnecessary movements required in loading and unloading of the wafer to and from the fixed spindle fingers. Predominantly, in conventional SRD modules, the loading of the wafer onto the fixed spindle fingers involves four stages. That is, to receive a wafer, initially, the chuck is moved upwardly and out of the bowl, such that the chuck is positioned above the wafer process plane. As a result of having fixed spindle fingers, to deliver the unprocessed wafer to the edges of the spindle fingers, at the outset, the end effector having the wafer is moved horizontally over the bowl at a level that is above the horizontal plane of the spindle fingers (which are already in the up position). Thereafter, the end effector must move downwardly (while over the bowl) until the wafer reaches the level of the spindle fingers. At this point, the spindle fingers can engage the wafer. Once the spindle fingers have engaged the wafer, the end effector relinquishes the wafer and thus physically delivering the unprocessed wafer to the spindle fingers. Finally, to pull out, the end effector is required to move slightly down and away from the wafer under surface before moving horizontally away from over the bowl. Each of the up and down movements of the end effector are performed using the "Z" speed of the end effector, which in fact is a significantly low speed. As such, the performing of a spin, rinse and dry operation on each wafer requires a significant amount of time simply to load and unload the wafer, thus increasing the SRD cycle per wafer. As can be appreciated, this reduces the overall throughput of the SRD module.

Yet another shortcoming associated with conventional chucks of SRD modules is the creation of air turbulence above the wafer surface. That is, as the chuck and thus the wafer spin in the bowl, the spinning action of the chuck and the wafer transfer energy to air flowing over the top side of the wafer. This transferred energy causes the airflow above the topside of the wafer to become turbulent and thus creates recirculating air (i.e., eddies). The amount of energy transferred to the air flowing to the topside of the wafer depends on the diameter and the rotational speed of the wafer. In general, the greater the amount of energy transferred to the air, the higher the eddies extend above the topside and the farther the eddies extend below the backside of the wafer. The presence of eddies below the wafer is undesirable because particles or DI water droplets removed from the wafer can circulate in the eddies and can be re-deposited on the backside of the wafer, thereby causing wafer recontamination.

Further challenges faced in the use of conventional chucks are the limitations associated with the chuck geometry. Mainly, the relatively large size and associated weight of conventional flat chucks necessitate the use of significantly higher amounts of energy to operate the SRD module. Additionally, the large size of the chuck further requires the use of larger shafts as well as spindles. Collectively, these limitations mandate the use of a larger and more powerful motor, thus increasing the cost of the SRD modules as well as the associated operating cost.

Yet another challenge faced in the use of chucks in SRD modules is having chemically incompatible components present within the modules. In a typical SRD module, most components are constructed from several different materials. For instance, the chuck is usually constructed from Aluminum, while the bowl is made out of Polyurethane, and the spigot is made out of stainless steal. As a result, particles or contaminants from chemically incompatible components may enter into chemical reaction with the fluids introduced into the SRD module, thus further recontaminating the SRD module. This recontamination can further be exacerbated by the aluminum chuck having to continuously move up and down (e.g., to load and unload each new wafer) within the bowl. That is, as the chuck moves up and down within the bowl, some of its coating may flake off of the chuck, thus generating particulates and contaminants inside the bowl and the SRD module. In some cases, these contaminants may react with the residual chemicals (e.g., HF, $NH_3OH$, etc.) present in the SRD module from previous brush scrubbing operations. It is believed that these chemical reactions between the residual chemicals and the generated particulates and contaminants of the chuck may cause the recontamination of the wafer as well as the SRD module.

In view of the foregoing, a need therefore exists in the art for an apparatus that controls and reduces the airflow to a backside of a substrate during a spin, rinse, and dry operations. Additionally, there is a need for a chemically compatible chuck assembly that improves the spin, rinse, and dry operations performed on the surfaces of substrates while reducing the risk of wafer recontamination.

SUMMARY OF THE INVENTION

Broadly speaking, the present invention fills these needs by providing an apparatus and related methods for optimizing the spin, rinse, and dry operations of a spin, rinse, and dry (SRD) module. The SRD module implements a wafer backside plate designed to control air turbulence around a substrate so as to reduce recontamination to the under-surface of the substrate. Preferably, in one embodiment, reducing recontamination to the under-surface of the substrate is achieved by placing the top-surface of the wafer backside plate and the under-surface of the substrate substantially on the same plane. In one preferred implementation, the top-surface of the wafer backside plate and the under-surface of the substrate are placed on the substantially same plane by a chuck assembly rotating at high RPMs, thus throwing the wafer backside plate to an up position.

It should be appreciated that the present invention can be implemented in numerous ways, including as a process, an apparatus, a system, a device, or a method. Several inventive embodiments of the present invention are described below.

In one embodiment, an apparatus for preparing a wafer is disclosed. The apparatus includes a wafer backside plate and a central shaft. The wafer backside plate has a top surface that includes a cylindrical edge lip, which defines a central aperture. The central shaft is designed to fit within the central aperture. The wafer backside plate is configured to automatically slide between an up position during rotational wafer processing and a down position when the wafer is not in rotational wafer processing. A gap defined between the top surface of the wafer backside plate and the wafer is less when the wafer backside plate is in the up position than when the wafer backside plate is in the down position.

In another embodiment, an apparatus for preparing a wafer is disclosed. The apparatus includes a chuck having a plurality of grippers for holding the wafer, a wafer backside plate, and a shaft. The wafer backside plate has a top surface and includes a cylindrical edge lip that defines a central aperture. The shaft is connected to a central portion of the chuck and is configured to receive and engage the central aperture of the backside plate. The wafer backside plate is configured to automatically slide between an up position during rotational wafer processing and a down position when completing rotational wafer processing. A gap defined between the top surface of the wafer backside plate and the wafer is less when the wafer backside plate is in the up position than when the wafer backside plate is in the down position.

In yet another embodiment, an apparatus for spinning, rinsing and drying a wafer is disclosed. The apparatus includes a chuck, a wafer backside plate and a shaft. The chuck has a plurality of wafer holders for holding the wafer during the spinning, rinsing and drying. The wafer backside plate has a disk-like top surface that mirrors the wafer being held by the holders above the wafer backside plate. The wafer backside plate includes a cylindrical edge lip at a center that has an inner surface, which defines a central aperture. The shaft is connected to a central portion of the chuck and is configured to receive and engage the central aperture of the backside plate. The wafer backside plate is configured to automatically slide between an up position during rotational wafer processing and a down position when completing rotational wafer processing. A gap defined between the top surface of the wafer backside plate and the wafer is less when the wafer backside plate is in the up position than when the wafer backside plate is in the down position.

In still a further embodiment, a method for spinning a wafer to enable rinsing and drying is disclosed. The method includes engaging the wafer at a wafer processing plane and spinning the wafer. The method further includes raising a wafer backside plate from a lower position to an upper position as the spinning of the wafer proceeds to an optimum spinning speed. The upper position defines a reduced gap between an under surface of the wafer and a top surface of the wafer backside plate. The method also includes lowering the wafer backside plate from the upper position to the lower position as the spinning reduces in speed. The lower position defines an enlarged gap to enable loading and unloading of the wafer from the engaged position.

In still a further embodiment, a method for spinning a wafer to enable rinsing and drying is disclosed. In this method a wafer is engaged at a wafer processing plane and is spun with a wafer backside plate, which is defined below the wafer processing plane. The wafer backside plate is then raised from a lower position to an upper position as the spinning of the wafer proceeds to an optimum spinning speed. The upper position defines a reduced gap between an under surface of the wafer and a top surface of the wafer backside plate. Then, the wafer backside plate is lowered from the upper position to the lower position as the spinning reduces in speed. The lower position defines an enlarged gap to enable loading and unloading of the wafer from the engaged position.

In yet another embodiment, a method for spinning a wafer to enable rinsing and drying is provided. In this method a wafer is provided over a process bowl and is engaged at a wafer processing plane. The wafer and the wafer backside plate that is defined below the wafer processing plane are then spun. The wafer backside plate is raised from a lower position to an upper position as the spinning of the wafer proceeds to a process spinning speed. The upper position defines a reduced gap between an under surface of the wafer and a top surface of the wafer backside plate. The wafer backside plate is then lowered plate from the upper position to the lower position as the spinning reduces in speed. The lower position defines an enlarged gap to enable loading and unloading of the wafer from the engaged position.

In yet another embodiment, a method for spinning a wafer to enable rinsing and drying is disclosed. In this method a wafer is provided over a process bowl, which is then engaged at a wafer processing plane. The wafer and a backside plate defined below the wafer processing plane are then spun. The wafer backside plate is raised from a lower position to an upper position as the spinning of the wafer proceeds to a process spinning speed. The upper position defines a reduced gap between an under surface of the wafer and a top surface of the wafer backside plate, wherein the reduced gap is designed to reduce turbulent airflow under the wafer. The wafer backside plate is then lowered from the upper position to the lower position as the spinning reduces in speed. The lower position defines an enlarged gap to enable loading and unloading of the wafer from the engaged position. The wafer is then disengaged and removed from over the process bowl. These operations are repeated for all additional wafers.

The advantages of the wafer backside plate of present invention are numerous. Most notably, unlike the conventional fixed wafer backside plates, the wafer backside plate of the present invention is liftable and is configured to move between up and down positions. Thus, the liftable wafer backside plate reduces recontamination to the under-surface of the substrate by placing the top-surface of the wafer backside plate and the under-surface of the substrate to be processed on a substantially same plane during the spinning operations. Accordingly, the embodiments of the present invention improve the quality of the spin, rinse, and dry operations of the SRD module while substantially simultaneously increase the overall throughput of the SRD module.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A is an isometric view of a fully put together chuck assembly in a closed position, in accordance with one embodiment of the present invention.

FIG. 3 is a schematic A—A cross-sectional view of the chuck assembly and wafer backside plate depicted in FIG. 2B, in accordance with yet another embodiment of the present invention.

FIG. 4 is a schematic cross-sectional view of a closed chuck assembly and a wafer backside plate as the chuck assembly assumes an open position, in accordance with still another embodiment of the present invention.

FIG. 8A is a simplified, schematic, cross-sectional view of a closed chuck assembly having a gripper in a substantially upright position, in accordance with another embodiment of the present invention.

FIG. 8B is a simplified, schematic, cross-sectional view of an open chuck assembly having a gripper in a substantially flat position, in accordance with yet another embodiment of the present invention.

FIG. 9A is a simplified, schematic, cross-sectional view of a chuck assembly gripper, in accordance with yet another aspect of the present invention.

FIG. 9B is a simplified, schematic, cross-sectional view of a chuck assembly roller, in accordance with still another aspect of the present invention.

FIG. 12 is a cross-sectional view of the chuck assembly and the wafer backside plate illustrated in FIG. 11, in accordance with one embodiment of the present invention.

FIG. 13 is an enlarged, partial, cross-sectional view of a chuck assembly in an open position with a wafer backside plate, in accordance with yet another embodiment of the present invention.

DETAILED DESCRIPTION OF EXEMPLARY EMBODIMENTS

Embodiments of a spin, rinse and dry module (SRD) and a wafer backside plate for use in an SRD module for optimizing the spin, rinse and dry operations performed on substrate surfaces while minimizing the possibility of wafer under-surface recontamination are described. Preferably, the SRD module implements a liftable wafer backside plate configured to be moved between up and down positions. In one exemplary embodiment, recontamination to the under-surface of the substrate is reduced by placing the top surface of the wafer backside plate and the under-surface of the substrate on the same plane. In one preferred implementation, the wafer backside plate is moved from its initial down position to the up position as a result of centrifugal force created by the increasing RPMs of a rotating chuck assembly. Preferably, in one example, the wafer backside plate is connected via wafer backside pins to a sleeve defined in a wedge contained within the chuck assembly. The wafer backside pins and the height adjusting slots defined on the sleeve are configured to collectively act as wafer backside plate motion stoppers. Preferably, the wafer backside plate is designed to control air turbulence around a substrate so as to reduce recontamination to the under-surface of the substrate.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

For ease of understanding, a detailed description of the chuck assembly will be provided in Section 1, and a detailed description of the wafer backside plate will be provided in Section II.

I. Chuck Assembly

Figure 1:
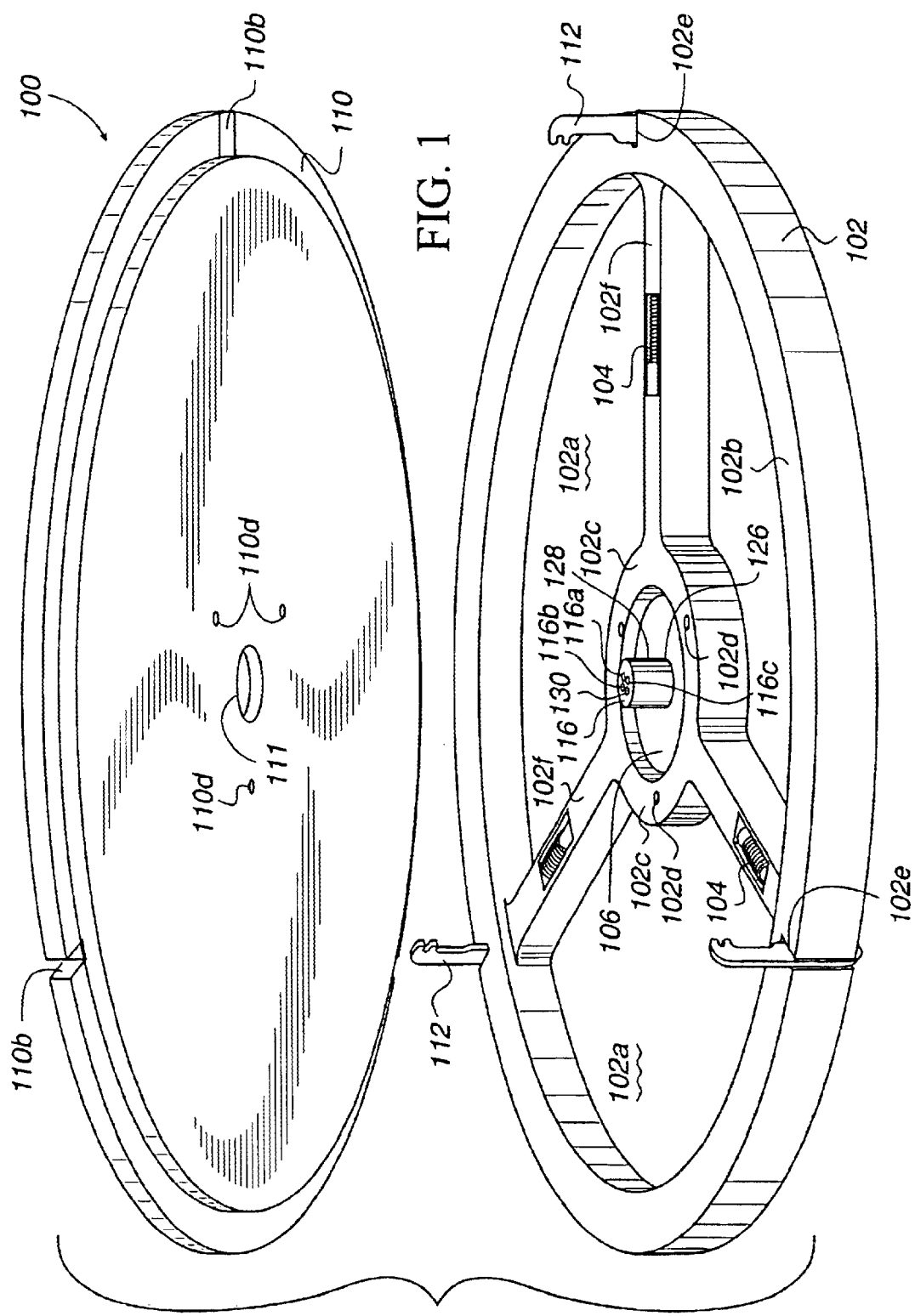
FIG. 1 is an isometric view of a chuck body and a chuck top plate of a chuck assembly, in accordance with one embodiment of the present invention.

FIG. 1 is an isometric view of a chuck body 102 and a chuck top plate 110 of a chuck assembly 100, in accordance with one embodiment of the present invention. As shown, the chuck body 102 is in the shape of a cylindrical disk, as the cylindrical shape advantageously creates substantially less air disturbance in the SRD module, thus improving airflow around the substrate surface. In an exemplary embodiment, the inertia of the cylindrical chuck assembly 100 is reduced by forming hogged-out regions 102a within the chuck body 102. By way of example, the hogged-out regions 102a may be formed by machining out specific inner portions of the chuck body 102. As a result of forming the hogged-out regions 102a, the weight of the chuck body 102 is reduced, thus enabling the use of substantially less amount of energy to rotate the chuck assembly 100, thereby allowing the use of a substantially smaller motor (not shown in the Figure).

As shown, the exemplary embodiment of FIG. 1 includes 3 hogged-out regions 102a defining spokes 102f, a chuck outer ring 102b and a chuck inner ring 102c. The spokes 102f are configured to extend from the chuck outer ring 102b to the chuck inner ring 102c. Each of the spokes 102f is further configured to house a linkage arm 112 having a length substantially equivalent to the length of its respective spoke 102f. Each of the linkage arms 112 has an outer end and an inner end and is configured to cause the respective gripper 112 to move between open/close positions, as a wedge 106 moves between a lower position and an upper position. In one implementation, the wedge 116 may be a conical-type wedge. As depicted, the wedge 106 is defined within the chuck inner ring 102c of the chuck 102 and is designed to exert tension on each of the linkage arms 112 and the respective gripper 112 as the wedge 106 moves between an upper position and a lower position. In one embodiment, as shown in FIG. 1, this tension is created by spring loading each of the linkage arms 112 by nesting a segment of each of the linkage arms 112 within a spring 104. However, it must be noted that although in this embodiment a spring has been implemented to create such tension, it must be understood by one of ordinary skilled in the art that any appropriate mechanism may be used.

Further shown in FIG. 1 are chuck body gripper motion slots 120e, which are configured to allow each of the grippers to pivot about a respective rotation pin 120 (not shown in this Figure). In one embodiment, when the wedge 106 is in the upper position, each of the grippers 112 pivot about the respective rotation pin 120 and is moved backward such that the grippers lay almost parallel to the chuck top plate 110. However, when the wedge 106 moves down to the lower position, the grippers 112 are configured to rotate about the respective rotation pin 120 in the chuck body gripper motion slot 102e so as to assume an upright position. Additional details regarding the wedge 106, the grippers, the chuck assembly 100, and their mechanisms are set forth below in connection with the descriptions of FIGS. 2–9B.

Further included in FIG. 1 is the chuck top plate 110, which in this implementation, is configured to be in the shape of a cylindrical plate cover. The chuck top plate 110 will thus isolate the moving parts of the chuck body 102 from the wafer, and reduce potential contamination from particulates generated by moving parts. The chuck top plate 110 includes a plurality of chuck top plate gripper motion slots 110b, each designed to enclose a respective gripper 112. As depicted, the chuck top plate 110 is configured to be secured to the chuck body 102 by way of a plurality of fastening holes 100d designed on the chuck top plate 110 such that their positions are over a plurality of joining holes 102d which are formed around the inner ring 102c of the chuck body 102. Screws, not shown, are then attached through the fastening holes and the joining holes 102d. Further shown is a chuck top plate bore 111 that is configured to engage a manifold 116 located within a wedge 106.

As shown, the wedge 106 is to include a central throughbore 126. In one implementation, the throughbore 126 is designed to hold a sleeve 128 (not shown in this Figure) configured to contain fluid delivery tubes. The fluid delivery tubes are formed in the manifold 116. The manifold 116 has a plurality of ports 116a, 116b, and 116c designed to deliver fluids to a backside of a wafer. In one embodiment, the presence of the wafer is configured to be detected through a use of a wafer presence sensor 130 defined at about the center of the manifold 116.

Preferably, unlike the conventional chucks wherein the chuck body moves up and down within the process bowl, in the present invention, rather than the chuck body 102, the wedge 106 has been designed to vertically move within the chuck assembly 100. Thus, advantageously, the chuck assembly 100 is designed to remain at a fixed height. In this manner, unlike prior art chucks which use the vertical movement of the chuck itself to load/unload the wafer, the embodiments of the present invention utilize the vertical movement of the wedge 106 to cause the grippers to engage/disengage the wafer to be processed. Consequently, the present invention has several advantages over the prior art. First, as the chuck body 102 remains at a fixed height, unlike the prior art SRD module, the present invention eliminates the problems associated with the necessity of designing a complex chuck. Second, as the chuck body 102 remains in place horizontally, the chuck assembly 100 does not introduce further contaminants and particulates into the SRD bowl. In one embodiment, the SRD bowl 202 may be a bowl as described in U.S. patent application Ser. No. 09/470,676, filed on Dec. 23, 1999, having inventors Roy Winston Pascal and Brian M. Bliven, and entitled "Bowl, Spin, Rinse, and Dry Module, and Method for Loading a Semiconductor Wafer into a Spin, Rinse, and Dry Module." This U.S. Patent Application, which is assigned to Lam Research Corporation, the assignee of the subject application, is incorporated herein by reference.

FIG. 2A is an isometric view of a chuck assembly 200 in a closed position, in accordance with one embodiment of the present invention. As shown, a fully assembled chuck 200 includes a chuck body 102 connected to a chuck top plate 110. The chuck body 102 and the chuck top plate 110 are both configured to be in the shape of a cylindrical disk. As discussed with regards to FIG. 1, the chuck top plate 110 includes a chuck top plate bore 111 and a contiguous cylindrical ring 111' defined at about the center of the chuck top plate bore 111. As shown, when the chuck top plate 110 is placed over the chuck body 102, the chuck top plate 110 hides the wedge 106. Furthermore, when the wedge 106 is in the up position, the chuck top plate 110 is positioned such that a small gap exists between the wedge top surface 106c of the wedge 106 and the chuck top plate 110. However, when the wedge 106 is in the down position, a larger gap exists between the chuck top plate 110 and the wedge top surface 106c of the wedge 106. In one exemplary embodiment, the top surface 110a of the chuck top plate 110 is placed on top of the chuck body 102 such that the chuck top plate 110 is defined below the wafer process plane.

A plurality of grippers 112 are coupled to the chuck body 102 and are configured to pivot about the respective rotation pins 120 (not shown in this drawing). The grippers 112 are further configured to protrude above the top surface 110a of the chuck top plate 110 and chuck top plate gripper slots 110b. As shown in the embodiment of FIG. 2A, when the chuck assembly 200 is in the closed position, the grippers are configured to assume an upright position so as to engage the wafer to be processed. The chuck top plate gripper slots 110b as well as the chuck body gripper slots are configured to facilitate the pivotal movement of the grippers. The advantage of implementing grippers capable of assuming both upright and flat positions is that the grippers 112 can substantially pivot about the rotation pin (or other mechanism) so as to assume a position that is substantially parallel to the chuck top plate 110. This is beneficial as it eliminates additional mechanical movements required in loading and unloading of the chuck, as the end effector is no longer required to be raised above the gripper to load/unload the wafer. This is achievable because the grippers 112 no longer block the end effector as it loads/unloads the wafer, because in the open position, the grippers 112 lay flat.

The chuck top plate 110 is configured to be clamped to the chuck body 102, thereby sealing the linkage mechanism within the chuck assembly 200. In another example, the chuck body 102 may be fastened to a spindle. However, it must be appreciated by one of ordinary skill in the art that any appropriate fastening mechanism may be used to fasten the chuck body 102 to the chuck top plate 110.

Also shown is a wafer backside plate 114 configured to be positioned over the top surface 110a of the chuck top plate 110. As illustrated, the wafer backside plate 114 is configured to have a central hole 114a and a contiguous cylindrical edge 114b defined around the central hole 114a. The wafer backside plate 114 is configured to reduce recontamination to the backside of the wafer being processed.

In one implementation, the chuck body 102, the top surface 110a of the chuck top plate 110, the grippers 112, and the wafer backside plate 114 are constructed from Teflon™. However, it must be appreciated by one of ordinary skill in the art that the chuck body 102, the chuck top plate 110, the grippers 112, and the wafer backside plate 114 may be constructed from any chemically inert material (e.g., Hastalloy, High Speed Enchanted Plastic, Turchite, Polypropylene, PET, PEEK, VESPEL, DURALON, Teflon, etc.) This is beneficial because unlike conventional SRD modules which implement incompatible components thus causing module recontamination, most of the components of the chuck assembly 200 of the present invention are constructed from chemically inert materials thus preventing introduction of almost any recontaminants into the SRD module.

The contiguous cylindrical lip 114b of the wafer backside plate 114 is configured to enclose a manifold 116, as the manifold 116 protrudes above the top surface 106c of the wedge 106. Accordingly, in preferred embodiments, a radius of manifold 116 is configured to be less than a radius of the contiguous cylindrical lip 114b of the wafer backside plate 114, which in turn, is less than a radius of the contiguous cylindrical ring 111' of the chuck top plate 110. The manifold 116 includes a plurality of ports such as ports 116a, 116b, and 116c each designed to receive a fluid delivery tube. In one exemplary embodiment, different fluid may be delivered to each of the ports 116a–116c (e.g., DI water, HF, $NH_3OH$, nitrogen, CDA, non-residual cleaning solvents, etc.). In addition to the ports 116a–c, the manifold 116 is configured to include a wafer presence sensor 130. Additional details regarding the chuck assembly, gripper design, the manifold, and their mechanisms are set forth below in connection with the description of FIGS. 3-9B.

Figure 2B:
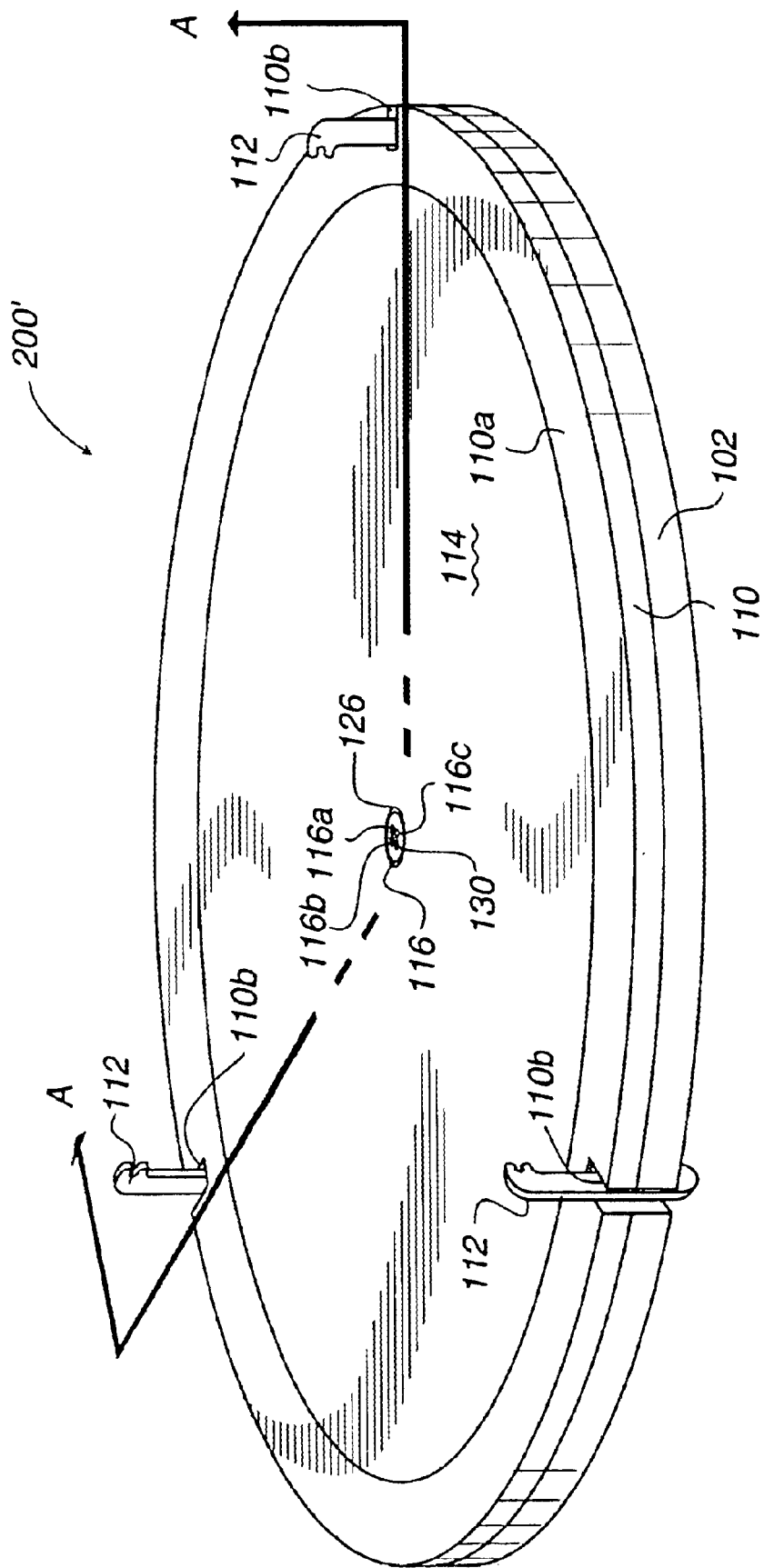
FIG. 2B is an isometric view of a fully put together chuck assembly in a closed position including a wafer backside plate, in accordance with another embodiment of the present invention.

FIG. 2B is an isometric view of a fully put together chuck assembly 200' in a closed position as it includes a wafer backside plate 114, in accordance with one embodiment of the present invention. As illustrated, the wafer backside plate 114 is placed over a chuck top plate 110 such that the wafer backside plate is substantially in the same horizontal plane as a manifold 116 and below a wafer process plane. By having the chuck top plate 110 and the wafer backside plate 114 below the wafer process plane, several mechanical movements in loading and unloading of the wafer can be eliminated, thus increasing the overall throughput of the SRD module. For instance, because the grippers 112 have the capability to pivot about the respective rotation pins 120 to load/unload a wafer, they simply assume a flat position during the loading/unloading of the wafer. That is, when the grippers 112 are substantially flat, the end effector can easily load/unload the wafer to the grippers without first having to be raised above the wafer process plane. For instance, in one embodiment, to deliver a wafer, the grippers are first placed in the open/flat position. Then, the end effector delivers the wafer substantially in the same level as the wafer process plane. Thereafter, the grippers 112 are placed in an upright/closed position, thus engaging the wafer. Although in this embodiment an end effector has been used to load/unload wafer 118, it must be appreciated by one of ordinary skill in the art that other equivalent mechanism may be utilized so long as the function of loading and unloading the wafer 118 to the grippers 112 is achieved.

A schematic A—A cross-sectional view of the chuck body 200' of FIG. 2B is depicted in FIG. 3, in accordance with another embodiment of the present invention. As shown, each of the linkage arms 122 is coupled to a respective gripper 112 with a respective linkage pin 122a, and each of the grippers 112 is coupled to a chuck body 102 using a respective rotation pin 120. Each of the grippers 112 is configured to rotate about the respective rotation pin 120 while the rotation pins 120 are configured to be substantially fixed. Although in this embodiment a rotation pin 120 is used to couple each of the grippers 112 to the chuck body 102, it must be noted that in a different embodiment, any other appropriate mechanism may be used to couple the gripper 112 to the chuck body 102.

Also shown in the embodiment of FIG. 3 is a chuck top plate 110 placed above the chuck body 102 and a wafer backside plate 114 as it is defined above the chuck top plate 110. Further depicted are the contiguous cylindrical ring 111' of the chuck top plate 110 as well as the contiguous cylindrical lip 114b of the wafer backside plate 114.

Each of the linkage arms 122 is configured to move substantially horizontally, thus exerting tension on the wedge 106 via a respective spring 104. In this embodiment, each of the springs 104 is shelved within the chuck body 102 without actually being connected to the chuck body 102 or the respective linkage arm 122. As shown, the tension steps 122b may be designed to a particular size to prevent each of the spring 104 from exerting excessive pressure onto a wedge sidewall 106e of the wedge 106. In one exemplary implementation, the tension created by each of the springs 104 is used to maintain the surface of the respective linkage arm 122 against the wedge sidewall 106e.

Further shown in the embodiment of FIG. 3 is a central throughbore 126 formed in the wedge 106. The wedge 106 is solid core and has a throughbore 126 that extends from a wedge bottom surface 106d to the wedge top surface 106c. Preferably, as the wedge 106 moves from a lower position to an upper position, the wedge 106 applies less pressure onto the linkage arms 122, which in turn, apply less pressure to the respective spring 104 and ultimately, to the respective spring step 122b. This decrease in exerted pressure on the linkage arms 122 further reduces the amount of pressure applied to the linkage-pins 122a and the grippers 112, thus causing each of the grippers 112 to pivot about the respective rotation pin 120. Consequently, each of the grippers 112 pivots backward about the respective rotation pin 120 so as to assume an open/flat position, thus disengaging the wafer 118.

However, as the wedge 106 moves from the upper position to the lower position, due to the shape of the wedge 106, gradually, the radii of the point of contacts of the linkage arms 122 and the wedge sidewall 106e increases, thus increasing the amount of pressure applied to each of the linkage arms 122 and consequently, the respective spring 104 and the respective linkage pin 122a. As a result of this increase in pressure, each of the grippers 112 is pivoted forward about the respective rotation pin 120 so as to assume an upright/closed position, thus engaging the wafer 118. As shown in the embodiment of FIG. 3, a gap exists between the wedge top surface 106c and the chuck top plate 110 allowing the wedge 106 to freely move between the lower position and the upper position.

FIG. 4 is a schematic cross-sectional view of a closed chuck assembly as it transitions to an open position, in accordance with one embodiment of the present invention. As shown, a wafer backside plate 114 is positioned above a chuck top plate 110, which in turn is placed above a chuck body 102. A linkage arm 122 is coupled to a gripper 112 with a linkage pin 122a, as a spring 104 is used to create tension between the linkage arm 122 and a wedge sidewall 106e. Thus, for a gripper 112 to assume an open/flat position, the linkage arm 122 is configured to move in a movement direction 122c. In one embodiment, the movement direction 122c is configured to be a movement in the horizontal direction.

As depicted, the wedge 106 includes a throughbore 126 extending from a wedge lower surface 106d to the wedge top surface 106c. As shown, a sleeve 128 is fed through the throughbore 126 such that the sleeve 128 protrudes above the chuck top plate 110 to be flush with the level as the wafer backside plate 114. A manifold 116 is inserted into the sleeve 128 and is fitted within a sleeve outlet 128a such that the manifold 116 is also defined within the same level as the wafer backside plate 114. The manifold 116 includes a wafer sensor presence 130 used to detect the presence of the wafer 118 as well as ports 116a and 116b implemented to deliver fluid onto the backside of a wafer 118.

As shown, the gripper 112 is assuming an open/flat position as the wedge 106 is moving to an upper position. That is, as the wedge 106 is moving upwardly, the radius of the wedge 106 at the point of contact of the linkage arm 122 and the wedge sidewall 106e decreases, thus placing less pressure onto the linkage arm 122 and the spring 104. As a result, the wedge 106 pulls on the linkage arm 112, thus decreasing the pressure applied onto the linkage pin 122, thus causing the gripper 112 to pivot back so as to disengage the wafer 118. At this point, an end effector blade 117 is holding the wafer 118. Additional details with respect to the wedge 106, the wedge mechanism, the manifold 116, the grippers 112, and the chuck mechanism are set forth below in connection with FIGS. 5A–9B.

Figure 5:
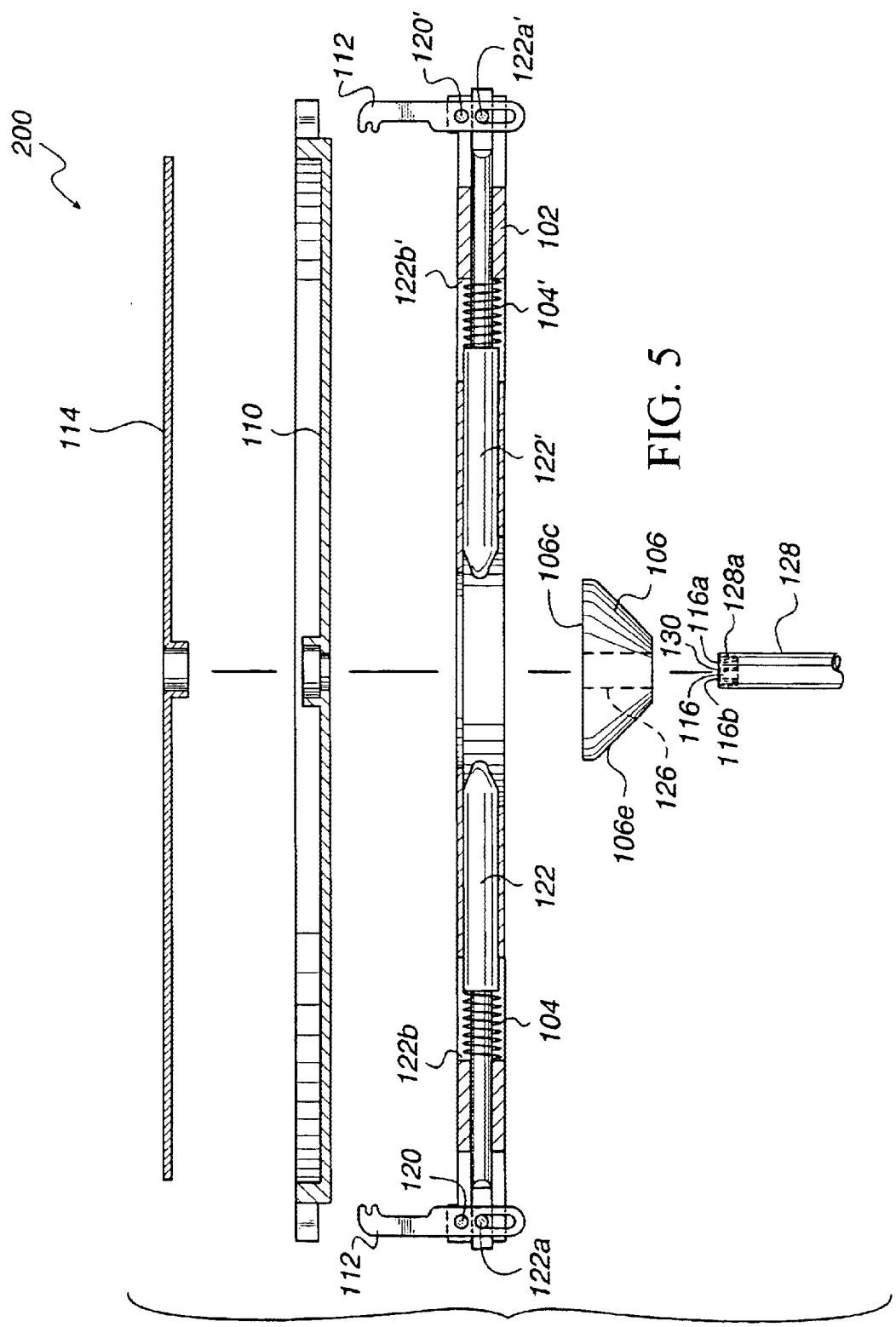
FIG. 5 is an exploded, partial cross-sectional view of a closed chuck assembly and a wafer backside plate, illustrating the individual components and the manner in which the components fit together to construct the chuck assembly, in accordance with one embodiment of the present invention.

FIG. 5 is an exploded cross-sectional view of a closed chuck assembly illustrating the individual components of the chuck assembly and the manner in which the components fit together to construct the chuck assembly, in accordance with one embodiment of the present invention. As shown, the manifold 116 is inserted into the sleeve outlet 128a as a sleeve 128 is fed into the throughbore 126 of the wedge 106. The wedge 106 is in turn defined within a chuck body 102 such that linkage arms 122 and 122' come into contact with the wedge sidewall 106e, as the wedge 106 moves between an upper position and a lower position within the chuck assembly 200. A Chuck top plate 110 having a cylindrical contiguous cylindrical ring 111' is defined on top of the chuck body 102 such that a gap is defined between the chuck top plate 110 and the wedge top surface 106c. This gap exists to accommodate the vertical movements of the wedge 106 within the chuck body 102. A wafer backside plate 114 is defined on top of the chuck top plate 110. As shown, the sleeve 128 is fed through the throughbore 126, the contiguous cylindrical ring 111' of chuck top plate 110, and the contiguous cylindrical lip 114b of the wafer backside plate 114 such that the manifold 116 is defined within substantially the same horizontal plane as the wafer backside plate 114 and below the wafer process plane.

Figure 6A:
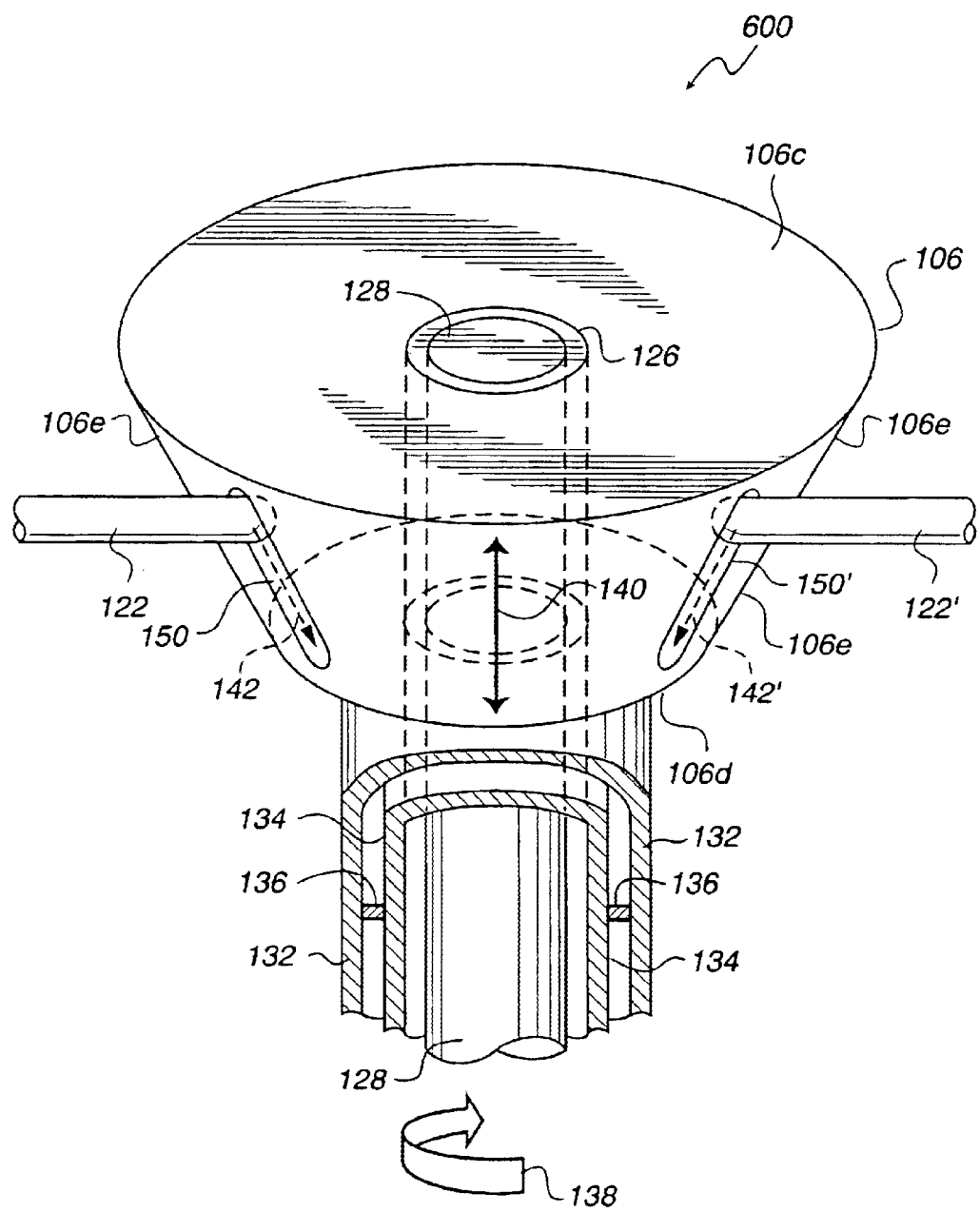
FIG. 6A is an isometric view of a wedge assembly as it assumes a lower position, in accordance with one aspect of the present invention.

FIG. 6A is an isometric view of a wedge assembly 600 as it assumes a lower position, in accordance with one embodiment of the present invention. A wedge 106 includes a wedge top surface 106c, a bottom surface 106d, and a wedge sidewall 106e. In one implementation, channels 150a and 150b may be defined substantially parallel to the wedge sidewall 106e so as to allow respective linkage arms 122 and 122' to move along the wedge sidewall 106e, from an upper position to a lower position and from a lower position to an upper position, as the wedge 106 moves upwardly and downwardly in a movement direction 140.

As shown, a linear drive shaft 134 is configured to be coupled to the wedge bottom surface 106d and is designed to define the diameter of a throughbore 126 defined within the wedge 106. The linear drive shaft 134 is configured to move the wedge 106 up and down in the movement direction 140 as the linear driver shaft 134 rotates in the rotation direction 138, thus causing the chuck assembly to assume an open or a closed position. Additionally, the linear drive shaft 134 is defined within a rotary drive shaft 132 and in one embodiment, is coupled to the rotary drive shaft 132 via pins 136. The rotary drive shaft 132 is designed to be substantially fixed in the X, Y, and Z-axes as it rotates in the rotation direction 138. Accordingly, the linear drive shaft 134 as well as the rotary drive shaft 132 are configured to rotate in the rotation direction 138. In one exemplary embodiment, the linear drive shaft 134 and rotary drive shaft 132 are configured to be constructed from substantially the same material (e.g., 300 series stainless steel, Hastalloy, Titanium, Aluminum, etc.).

As shown, a sleeve 128 is defined within the linear drive shaft 134 so as to protect the fluid delivery tubes (now shown) from the movements of the linear drive shaft 134. However, it must be understood by one of ordinary skill in the art that although in this embodiment the sleeve 128 has been implemented to protect the fluid delivery tubes from the rotational movement of the linear drive shaft 134, in a different embodiment, other isolation techniques may be used so long as the fluid delivery tubes are protected.

Figure 6B:
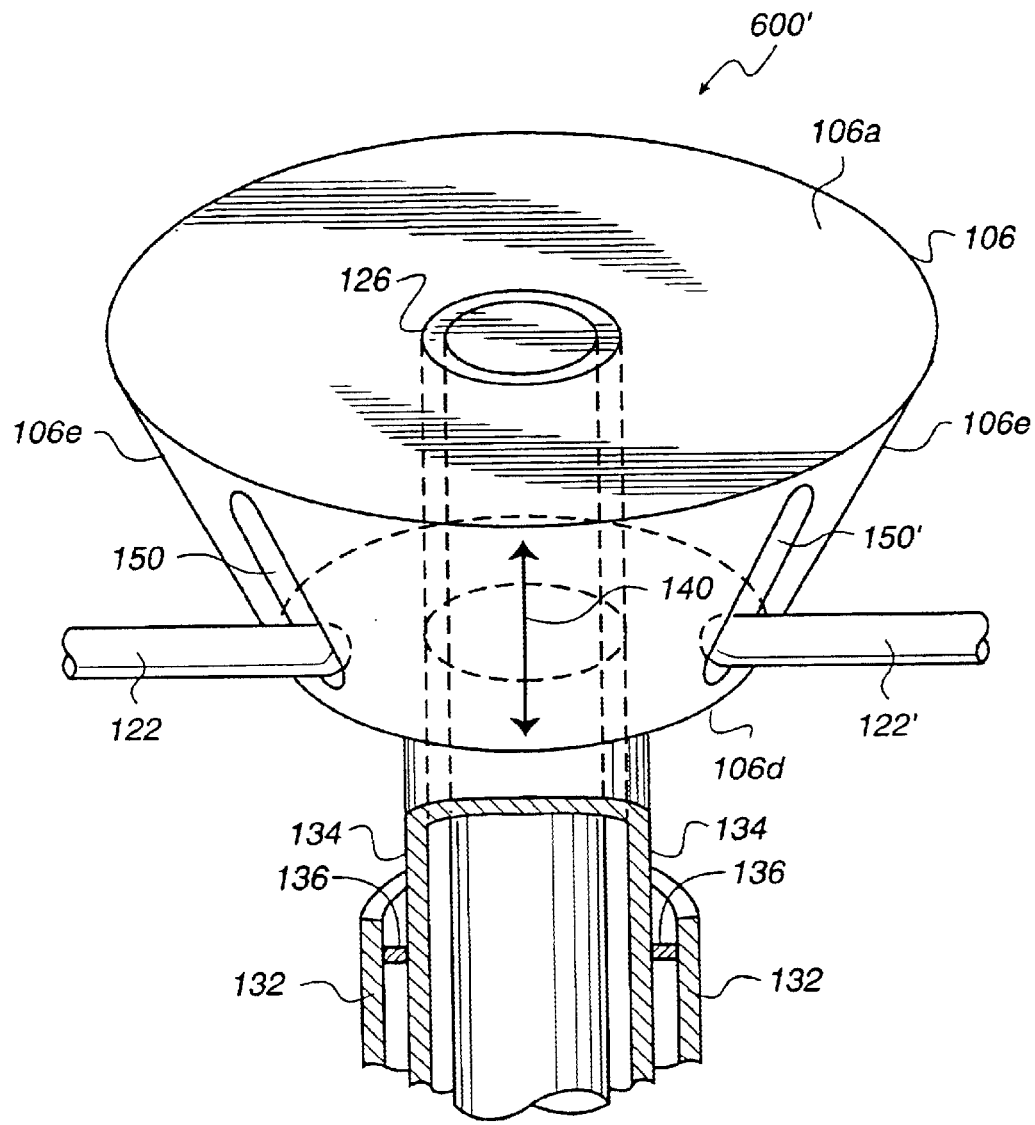
FIG. 6B is an isometric view of a wedge assembly as it assumes an upper position, in accordance with yet another aspect of the present invention.

The relationship of the linear drive shaft 134 and the rotary drive shaft 132 can further be understood with reference to FIG. 6B. As shown, while the linear drive shaft 134 is configured to be coupled to the wedge 106, the rotary drive shaft 132 is not. Accordingly, at some points in time, as the wedge 106 is moving between an upper position and a lower position in a movement direction 140, so does the linear drive shaft 134. However, as shown, in such instances, the rotary drive shaft 132 is maintained at a fixed height. This occurs because the rotary drive shaft 132 is not coupled to the wedge bottom surface 106d.

Although in the embodiments of FIGS. 6A and 6B the wedge 106 are configured to include channels 150 and 150' to facilitate the movement of the linkage arm 122 along the wedge sidewall 106e, it must be understood by one of ordinary skill in the art that any appropriate mechanism capable of facilitating the movement of the linkage arm 122 along the wedge sidewall 106e may be used instead of the channels 150 and 150' (e.g., keyways, surface to surface contact slide mechanisms, etc.) Furthermore, it must be noted that in one exemplary embodiment, one may choose not to implement any of such mechanisms on the wedge assembly 600'.

Figure 6C:
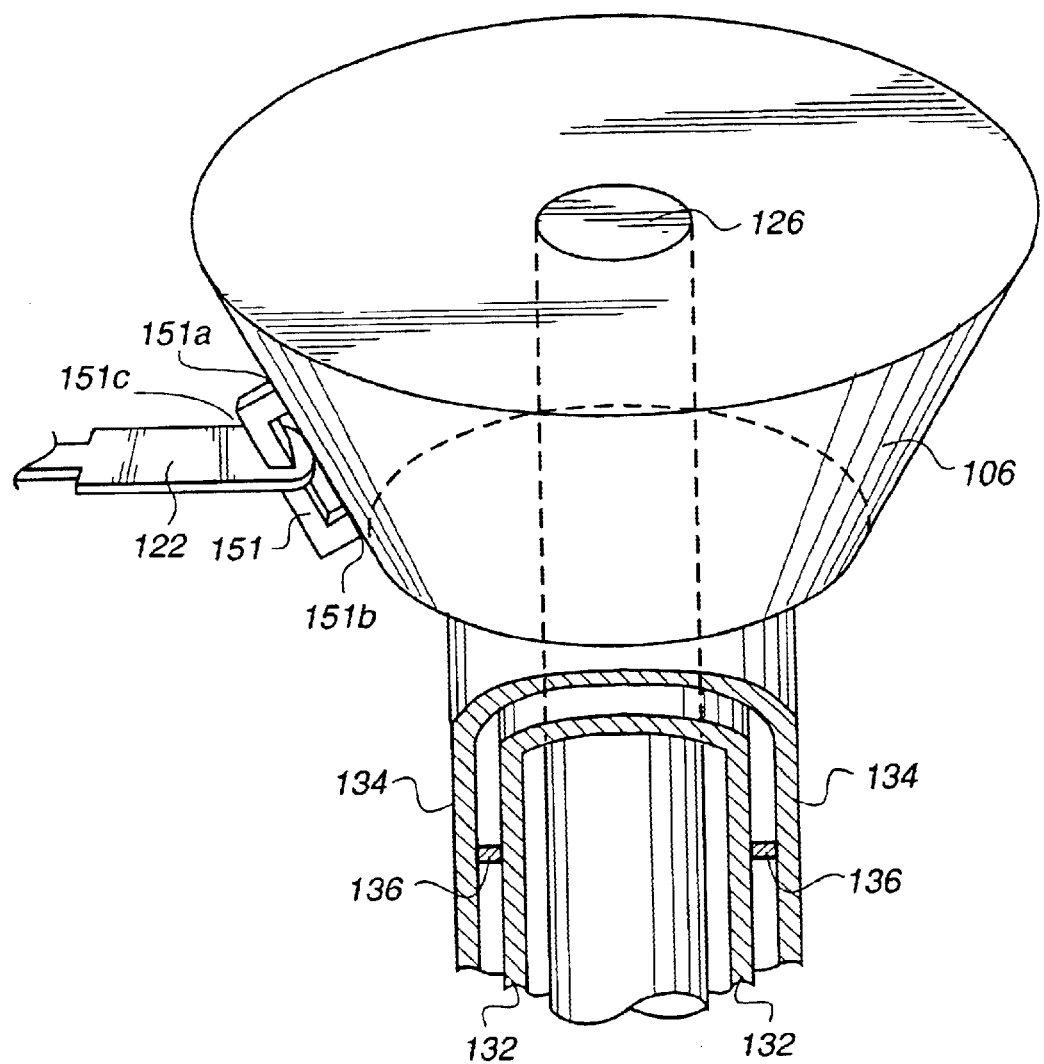
FIG. 6C is an isometric view of a wedge assembly implementing a key, in accordance with another aspect of the present invention.

For instance, as shown in the embodiment of FIG. 6C, instead of implementing a channel, a linkage arm 122 may be placed in contact with a wedge 106 via a keyway 151 coupled to a wedge 106 between points 151a and 151b. As shown, in the embodiments wherein the keyway 151 is used, there may not be a need to use a spring. Thus, in the instances wherein the wedge 106 is in the upper position, the linkage arm 122 contacts the keyway 151 at the point 151c, defined at about the upper part of the key 151. However, as the wedge 106 moves down to assume the lower position, the linkage arm 122 moves along the keyway 151 until it reaches almost the lower part of the key 151.

Figure 7A:
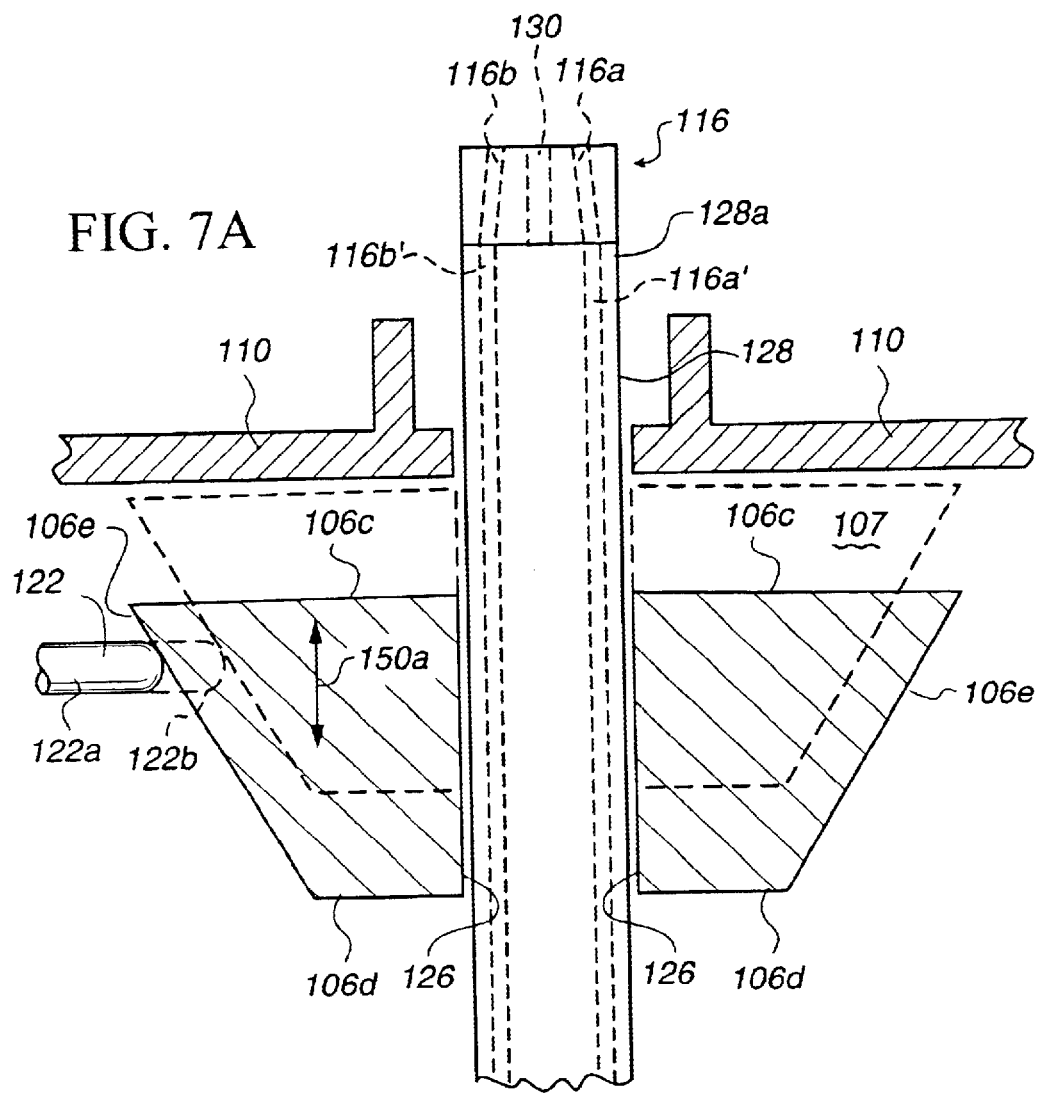
FIG. 7A is an exploded, schematic, cross-sectional view of a wedge assuming a lower position, in accordance with still another aspect of the present invention.

FIG. 7A is an exploded schematic cross-sectional view of a wedge 106 assuming an upper position, in accordance with one embodiment of the present invention. A wedge 106 includes a throughbore 126, which extends from a wedge bottom surface 106d to a wedge top surface 106c. A sleeve 128 is fed through the throughbore 126 such that the sleeve 128 protrudes above the wedge top surface 106c and above the chuck top plate 110. Preferably, the sleeve 128 is configured to be almost in the same level as the wafer backside plate 114 (not shown in this Figure), which is configured to be defined above the chuck top plate 110. A manifold 116 is inserted into the sleeve outlet 128a of the sleeve 128 and is configured to include a plurality of drilled ports 116a and 116b designed to receive fluid delivery tubes 116a' and 116b'. Also included in the manifold 116 is a wafer presence sensor 130.

As the wedge 106 moves upwardly to assume an upper position, the wedge sidewall 106e is pushed against the linkage arm 122, thus causing the linkage arm 122 to be moved along the wedge sidewall 106e in the movement direction 150a from a first position 122a to a second position 122b. As shown, a gap 107 is defined between the wedge top surface 106c and the chuck top plate 110 to prevent the wedge 106 from coming into contact with the chuck top plate 110 at the points in time the wedge 106 is in the upper position.

Figure 7B:
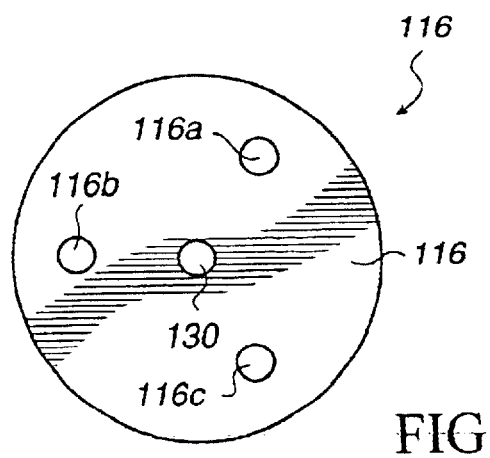
FIG. 7B is a top view of a manifold having a plurality of ports, in accordance with yet another aspect of the present invention.

FIG. 7B is a top view of a manifold 116 having a plurality of ports, in accordance with one embodiment of the present invention. Preferably, fluids are delivered through tubes that fit in the ports 116a–c so as to be implemented in the rinsing of the backside of the wafer 118. In addition to the ports 116a–c, the manifold 116 is configured to include a wafer presence sensor 130 that is used to detect the presence of a wafer.

FIGS. 8A and 8B are simplified schematic cross-sectional views of a closed chuck assembly 800 and an open chuck assembly 800', respectively, in accordance with one embodiment of the present invention. As shown in FIG. 8A, when a wedge 106 is in a lower position, a distance "d" between a point of contact 122b of a linkage arm 122 and a wedge sidewall 106e and a throughbore sidewall 126a is defined to be x. As illustrated, the distance x represents the horizontal distance between the throughbore sidewall 126a and the point of contact 122b. As shown, a gripper 112 of FIG. 7A has assumed an upright position thus engaging a wafer 118.

Comparatively, in FIG. 8B in which the wedge 106 is in an upper position, the distance "d'" between the point of contact 122b' of the linkage arm 122' and the wedge sidewall 106e is defined to be d' (i.e., x−Δx). As shown, the distance d' is the horizontal distance between the point of contact 122b' and a throughbore sidewall 126a. Accordingly, as depicted, the distance d is configured to be greater than the distance d', thus causing the pressure exerted on the wafer linkage 122 of FIG. 8A be greater than the pressure exerted on the wafer linkage 122' of FIG. 8B. As a result of this increase in exerted pressure on the linkage arm 122, a greater pressure is being applied on the linkage pin 122a, thus causing the gripper 112 to assume an upright/closed position. In contrast, as the wedge 106 moves up so as to assume an upper position, the amount of pressure exerted on the linkage 122' decreases, as the distance d' decreases, thus applying less pressure on the linkage pin 122a', causing the gripper 112' to rotate about the rotation pin 120 so as to assume a flat/open position.

FIGS. 9A and 9B are simplified schematic cross-sectional view of a chuck assembly gripper and a chuck assembly roller, in accordance with one embodiment of the present invention. In one preferred embodiment, as depicted in FIG. 9A, a gripper mouth 112" is configured to have a v-shape or an reshape. That is, the gripper mouth 112" is configured to engage a wafer 118 in substantially two points 112a and 112b, thus increasing the tolerance of the gripper 112 as it engages/disengages the wafer 118. For instance, the wafer 118 may be configured to be wedged between the two sloped faces of the gripper mouth 112". In this manner, the gripper 112 is designed such that the gripper 112 controls the direction of force being applied on to the wafer 118.

In one exemplary implementation, the chuck assembly may implement a roller assembly 113 to engage the wafer 118, which includes a roller portion 113a and a roller base 113b. As shown in the embodiment of FIG. 9B, the roller portion 113a is configured to engage a wafer 118 in two points 113a₁, and 113a₂ such that the roller portion 113a controls the amount of force placed on the wafer 118 while the wafer is engaged by the roller portion 113a. In one embodiment, the roller portion 113a may be implemented such that it can rotate. Preferably, the grippers 112 and the rollers 113 are configured to be constructed from chemically inert materials (e.g., Teflon™, Hastalloy, Engineered Plastics, stainless steel, etc.)

Figure 10:
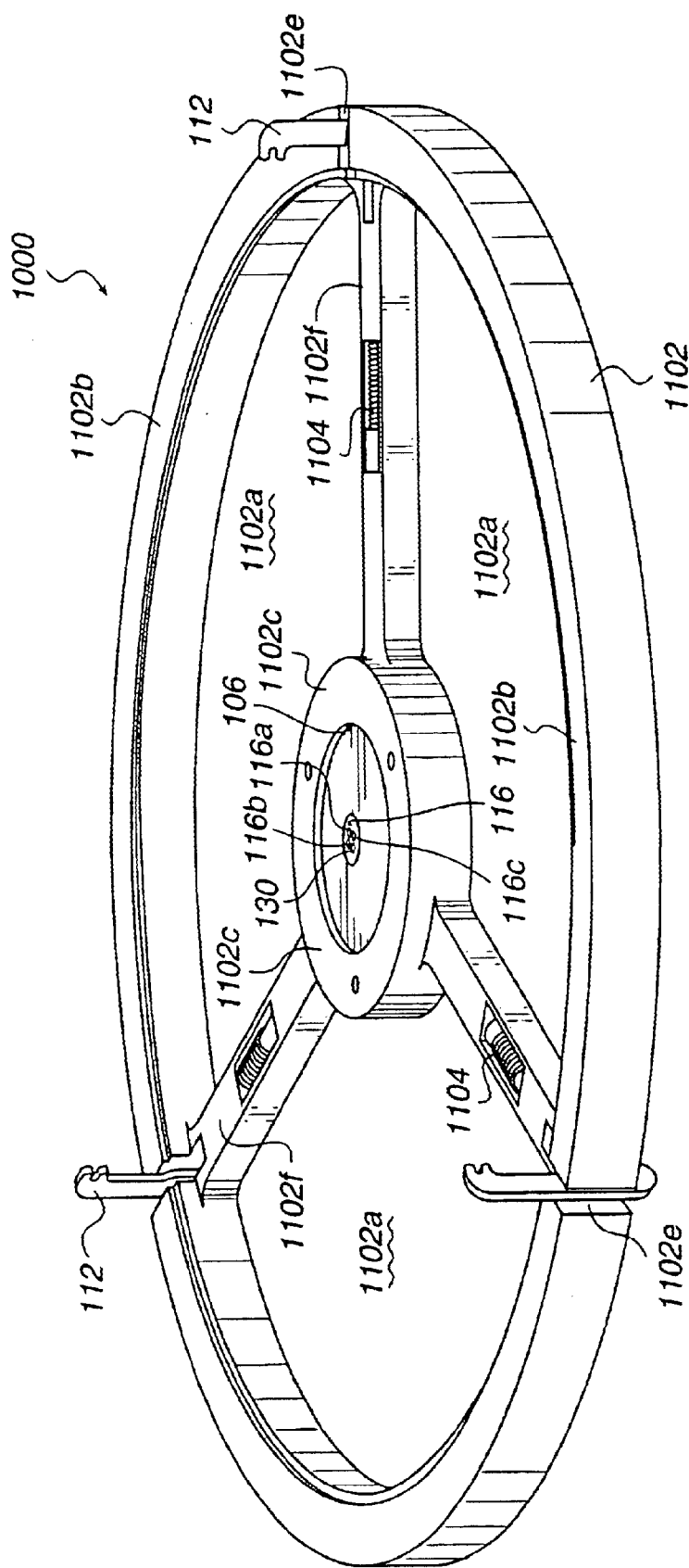
FIG. 10 is an isometric view of a chuck body of a chuck assembly in a closed position, in accordance with yet another embodiment of the present invention.

FIG. 10 is a simplified isometric view of a closed chuck assembly 1000, in accordance with another embodiment of the present invention. The chuck assembly 1000 includes a chuck body 1102, which in this embodiment is in the shape of a cylindrical disc. The chuck body includes an outer ring 1102b and an inner ring 1102c which are connected to one another via a plurality of spokes 1102f. Further shown are a plurality of hogged-out regions 1102a defined between the adjacent spokes 1102f. The hogged-out regions 1102a are defined so as to reduce the inertia of the chuck assembly 1000 thus creating a chuck assembly having a substantially less weight.

Each of the spokes 1102f is configured to house a linkage arm 112, each being substantially the same length as the respective spoke 1102f. In one exemplary embodiment, each of the linkage arms 112 uses a spring 104 to create tension between the wedge 106 and the respective gripper 112. In one embodiment, a spring 104 is configured to enclose portions of the linkage arms 112.

As illustrated, a wedge 106 is defined within the chuck inner ring 1102c and is configured to include an almost central throughbore 126. The throughbore 126 is designed to engage a sleeve which holds a manifold 116 having a plurality of ports 116a, 116b, and 116c designed to deliver fluids to a backside of a wafer.

Figure 11:
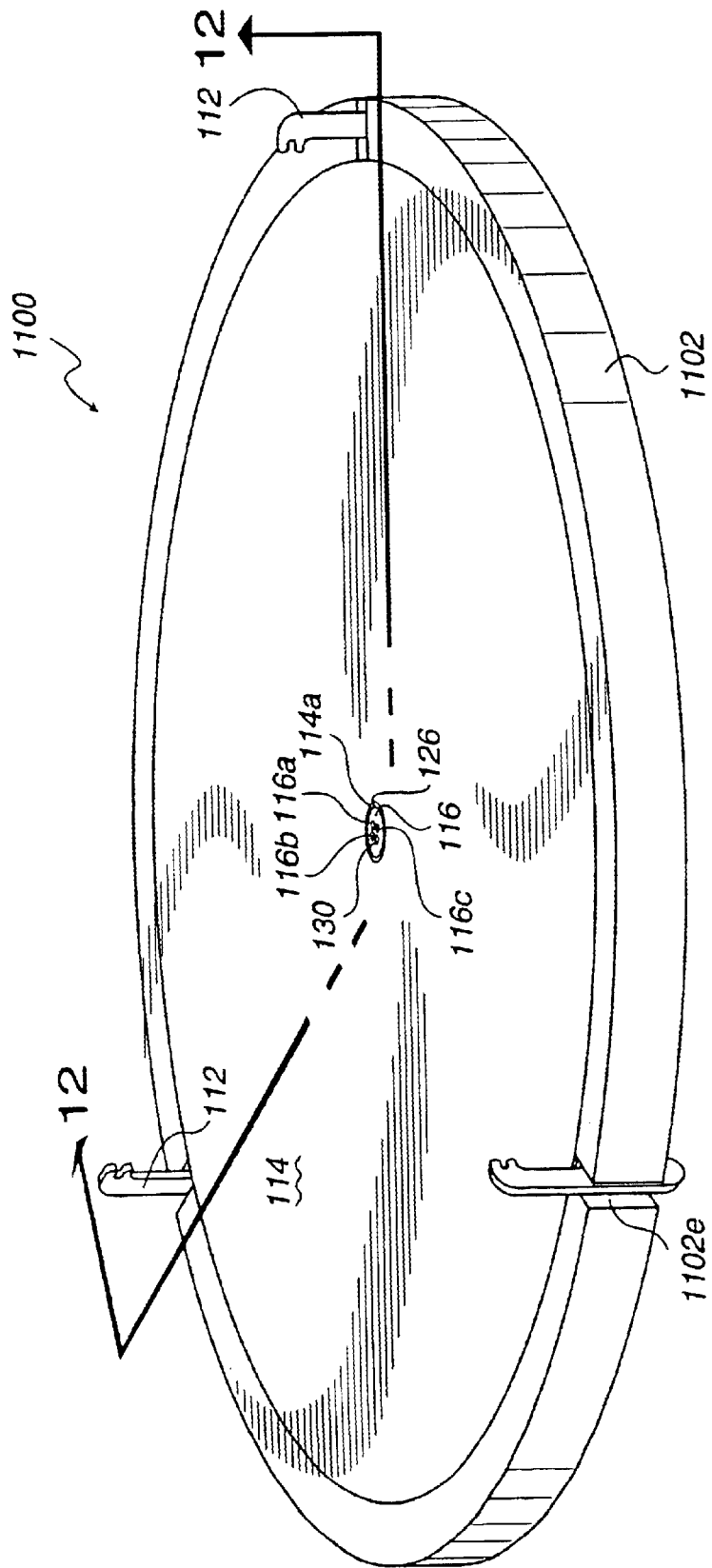
FIG. 11 is an isometric view of a fully put together chuck assembly and a wafer backside plate with the chuck assembly being in a closed position, in accordance with still another embodiment of the present invention.

FIG. 11 is an isometric view of a put together chuck assembly 1100 in a closed position, in accordance with one embodiment of the present invention. The assembled chuck 1100 includes the chuck body 1102 and the wafer backside plate 114 defined on top of the chuck body 1102. As shown, the wafer backside plate 114 substantially hides a wedge 106.

Preferably, when the wedge 106 is in the upper position, the wafer backside plate 114 is positioned on a rim 1102' (not shown in this Figure) of the chuck body 1102 such that a small gap exists between the top surface 1106c of the wedge 106 and the wafer backside plate 114. However, this gap is greater when the wedge 106 is in the lower position. As shown, the wafer backside plate 114 is placed over the chuck body 1102 such that the wafer backside plate 114 is defined below the wafer process plane. As defined, the wafer backside plate 114 is configured to prevent introduction of contaminants to the backside of the wafer 118. The wafer backside plate 114 is configured to be a cylindrical plate having an aperture 114a designed to enclose a manifold 116, as the manifold 116 protrudes above the wedge top surface 106c of the wedge 106. Thus, to achieve this, a radius of manifold 116 is configured to be less than the radius of the aperture 114a of the wafer backside plate 114. Further shown in FIG. 11 are a plurality of grippers 112 coupled to the chuck body 1102 as they have assumed an upright/closed position.

A cross-section 12—12 of the chuck body 1000 of FIG. 11 is depicted in FIG. 12, in accordance with another embodiment of the present invention. The gripper 112 is coupled to the linkage arm 122 with the linkage pin 122a and to the chuck body 1102 using the rotation pin 120. In one implementation, the rotation pin 120 is configured to be substantially fixed as the gripper 112 rotates about the rotation pin 120. Using a spring 104, the linkage arm 122 is designed to exert tension on a wedge sidewall 106e of a wedge 106 as the linkage arm 122 moves horizontally. A tension step 122b is used to prevent the spring 104 from exerting excessive tension onto a wedge sidewall 106e of the wedge 106. That is, in one embodiment, the tension created by the spring 104 is used to maintain the surface of the linkage arm 122 against the wedge sidewall 106e of the wedge 106.

Also shown in FIG. 12 is a wafer backside plate 114 as it is positioned above a rim 1102' of the chuck body 1102. The aperture 114a of the wafer backside plate 114 encloses the manifold 116, as the manifold 116 protrudes above the wedge top surface 106c of the wedge 106. Accordingly, in the embodiment of FIG. 12, a radius of manifold 116 is shown to be less than the radius of the aperture 114a of the wafer backside plate 114.

As illustrated, the wedge 106 is in a lower position, thus causing the grippers 112 to assume an upright/closed position. Preferably, a gap exists between the wedge top surface 106c of the wedge 106 and the rim 1102' of the chuck body 1102. As the wedge 106 moves from the upper position to the lower position, the radii of the wedge sidewall 106e at the point of contacts to the wedge sidewall 106e and the linkage arms 122 increases, thus increasing the amount of pressure applied to the linkage arms 122 and consequently, the springs 104 and the linkage pins 122a. This increase in pressure causes the grippers 112 to rotate about the respective rotation pins 120 as they are being pushed forward, thereby engaging the wafer 118 in an upright position.

FIG. 13 is a schematic cross-sectional view of a closed chuck assembly as it assumes an open position, in accordance with one embodiment of the present invention. As shown, the wedge 106 is in an upper position, as the gripper 112 is assuming a position substantially parallel to that of a wafer backside plate 114. As the wedge 106 moves upwardly, the radius of a wedge sidewall 106e at a point of contact of the linkage arm 122 and the wedge sidewall 106e decreases, thus placing less pressure on the linkage arm 122 and the spring 104. As a result of this decrease in pressure, the linkage arm 122 is pulled forward, pulling the gripper 112 back, thus causing the gripper 122 to assume a flat/open position, thereby disengaging the processed wafer.

II. Wafer Backside Plate

Figure 14:
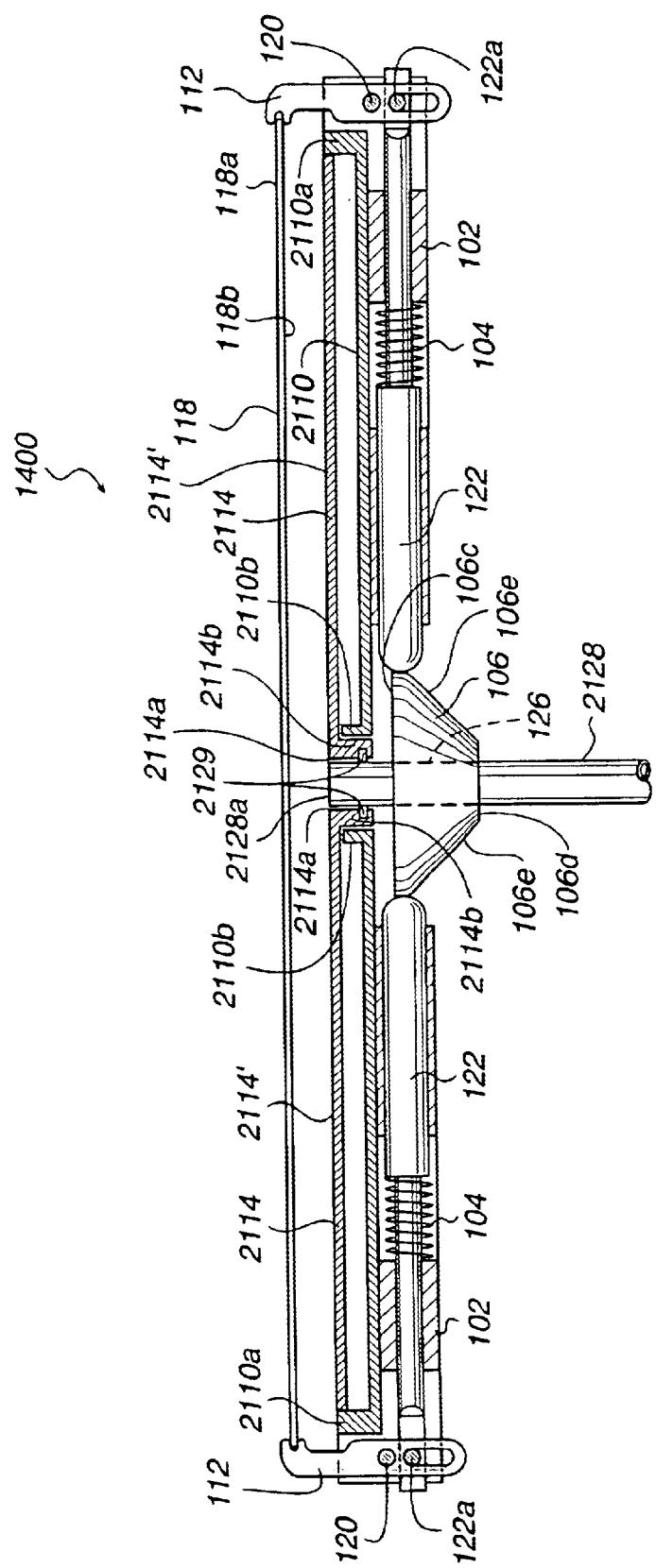
FIG. 14 is a cross-sectional view of a closed chuck assembly with a backside plate in a down position, in accordance with still another embodiment of the present invention.

Having the description the chuck assembly in mind, FIG. 14 is a cross-sectional view of a chuck assembly 1400 in a closed position and having a backside plate in a down post, in accordance wvith one embodiment of the present invention. As shown, the chuck assembly includes a chuck top plate 2110 defined on top of the chuck body 102. The chuck assembly 1400 includes a plurality of linkage arms 122, grippers 112, linkage pins 122a, and rotation pins 120, with each of the grippers being coupled to the respective linkage arm via the respective linkage pin 122a, while each of the grippers 112 is coupled to the chuck body 102 via the respective rotation pin 120. As shown, grippers 112 are configured to generally function as substrate holders.

The wedge 106 defined within the chuck body 102 includes the central throughbore 126 and is configured to move between the upper position and lower position. The movement of the wedge 106 causes the grippers 112 to assume either the upright/closed position to engage the wafer 118, or the flat/open position to disengage the wafer 118. A sleeve 2128 is fed into the throughbore 126 defined within the wedge 106 and is configured to be placed at the level of the wafer backside plate 2114. The sleeve 2128 can be viewed as a shaft and is configured to include height adjusting slots 2128a (not shown in this Figure) to control the vertical movement of the wafer backside plate 2114. Additional details regarding the shape of the height adjusting slots 2128a and their function are set forth below in connection with the descriptions of FIGS. 15 and 16.

The chuck top plate 2110 includes a cylindrical inner ring 2110b defined on a chuck top plate bore 2111, and a cylindrical outer ring 2110a defined at a circumference of the chuck top plate 2110. As shown, the inner ring 2110b and the outer ring 2110a are defined on the chuck top plate 2110 such that they face the wafer backside plate 2114. The wafer backside plate 2114 includes a cylindrical edge lip 2114b defined at on an aperture 2114a of the wafer backside plate 2114. Preferably, the radius of the aperture 2114a of the wafer backside plate 2114 is configured to be substantially smaller than the radius of the chuck top plate bore 2111 such that when the wafer backside plate 2114 is in a down position, the chuck ring 2110b and the edge 2114b of the wafer backside plate mate on a plane defined below the wafer process plane.

Further depicted in FIG. 14 are wafer backside pins 2129 defined on an outer sidewall $2114b_1$ of the wafer backside plate 2114. By way of example, as the chuck assembly 1400 starts to rotate and the RPMs of the chuck assembly 1400 increases, the centrifugal force created by the rotation of the chuck assembly 1400 causes the rotating wafer backside plate 2114 to be lifted from its initial down position and be shifted to the up position. As illustrated, when the wafer backside plate 2114 is in the down position, a gap exists between the wafer backside plate 2114 and the under-surface 118a of the wafer 118. That is, in the down position, the wafer backside plate 2114 is defined below the wafer 118 and the wafer process plane. This configuration is beneficial because the position of wafer backside plate 2114 does not prevent the end effector from loading/unloading the wafer 118 to the grippers 112.

Preferably, the wafer backside pins 2129 in conjunction with height adjusting slots 2128a are configured to function as wafer backside plate motion stoppers. As shown, in the down position, the wafer backside pins 2129 are defined at about the middle of that portion of the sleeve 2128 that protrudes above the top surface 106c of the wedge 106. More details with respect to the wafer backside pins 2129 and the height adjusting slots 2128a and their respective functions are set forth below in connection with the descriptions of FIGS. 15 and 16.

Figure 15:
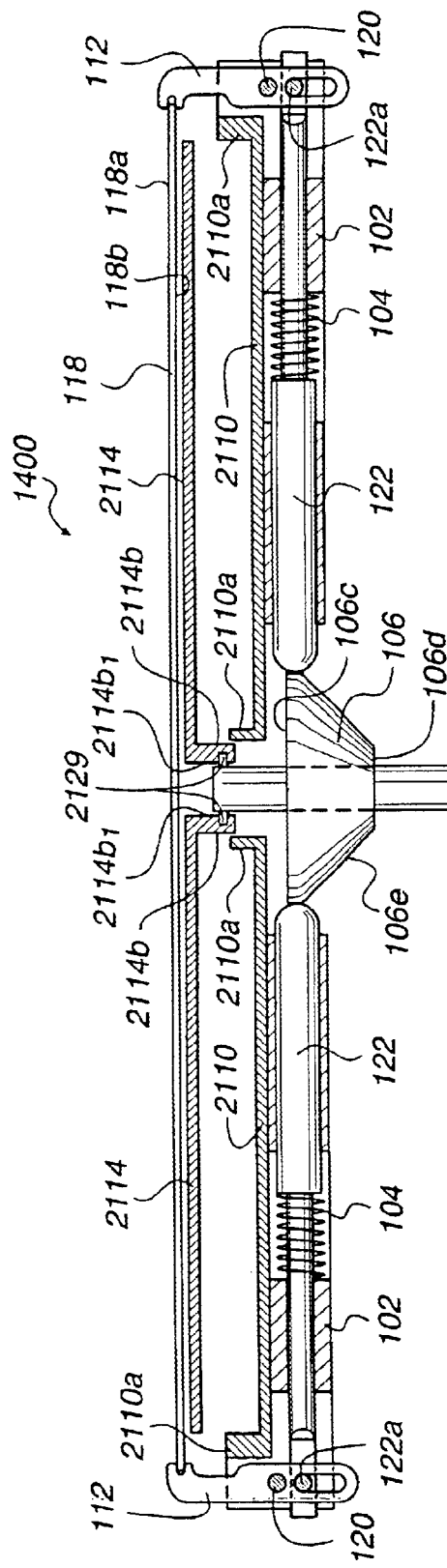
FIG. 15 is a cross-sectional view of a closed chuck assembly with a wafer backside plate in an up position, in accordance with still another embodiment of the present invention.

The mechanism of the wafer backside plate 2114 can further be understood in view of FIG. 15 as it depicts a closed chuck assembly 1400 with the wafer backside plate 2114 being in the up position, in accordance with one embodiment of the present invention. As shown, grippers 112 are defined in the upright position thus engaging the wafer 118 in the wafer process plane. Preferably, at the outset, the chuck assembly 1400 starts rotating in a movement direction 138 at low RPMs. Gradually, the RPMs of the Chuck assembly 1400 increases until it reaches a specific level, which in one embodiment, may be identified as a drying speed. At that point, the centrifugal force created by the rotary movement of the chuck assembly 1400 causes the wafer backside plate 2114 to rise tothe up position, as illustrated in FIG. 15.

As opposed to the embodiment of FIG. 14, in this embodiment, the wafer backside pins 2129 are in contact with the sleeve 2128 in contact points located close to the sleeve outlet 2128a. That is, as the wafer backside wafer 2114 shifts upwardly by the centrifugal forces, the wafer backside pins 2129 are lead through the respective height adjusting slots 2128a so as to reach the sleeve outlet 2128a.

As shown, the wafer backside plate 2114 is raised such that the top-surface 2114' of the wafer backside plate 2114 is nestled to the under-surface 118a of a wafer 118, as the wafer 118 is placed in the wafer process plane. That is, the top-surface 2114' of the wafer backside plate 2114 and the under-surface 118a of the wafer 118 are defined within the same plane. Thus, in contrast to FIG. 14 wherein a larger gap existed between the wafer 118 and the wafer backside plate 2114, in the view of FIG. 15, the gap made much smaller. Thus, in the embodiment of FIG. 15, the wafer backside plate 2114 is in position for processing the wafer 118. Furthermore, as the top-surface 2114' of the wafer backside plate 2114 and the under-surface 118a of the wafer 118 are almost within the same plane while the SRD module is operating, the under-surface 118a of the wafer 118 turbulent airflows are reduced thus reducing the degree of potential recontamination.

Figure 16:
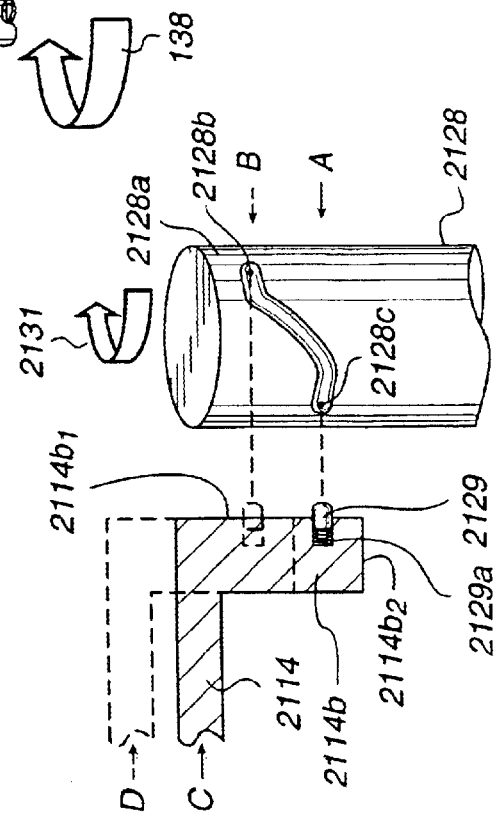
FIG. 16 is an exploded cross-sectional view a wafer backside plate and a sleeve having a height adjusting slot depicting the manner in which the backside plate pins work in conjunction with height adjusting slots to function as wafer backside plate motion stoppers, in accordance with yet another embodiment of the present invention.

FIG. 16 illustrates the conjunctive work of the backside plate pins and height adjusting slots to function as wafer backside plate motion stoppers, in accordance with one embodiment of the present invention. As shown, in this embodiment, wafer backside pins 2129 are defined close to a bottom wall $2114b_2$ of the cylindrical edge lip 2114b of the wafer backside plate 2114. Preferably, the wafer backside pins 2129 have a cylindrical shape and are retractable. That is, retractable springs 2129a are implemented between the wafer backside pins 2129 and the outer sidewall $2114b_1$ of the edge 2114b of the wafer backside plate 2114 so as to enable the wafer backside pins 2129 to retract into the cylindrical edge lip 2114b of the wafer backside plate 2114. Although in this embodiment only one wafer backside pin 2129 is depicted, it must be noted that an identical wafer backside pin 2129 is defined on the cylindrical edge lip 2114b in a substantially opposite and symmetrical location.

Also shown in FIG. 16 is the sleeve 2128 having height adjusting slots 2128a. Preferably, the height adjusting slots 2128a are curved channels carved into the sleeve 2128 such that the height adjusting slots 2128 extend between a height A and a height B. Thus, in one example, the wafer backside pin 2129 is inserted into the height adjusting slot 2128a through a point 2128c and is lead through the height adjusting slots 2128a until it reaches a point $2128_b$, defining the end of the height adjusting slots 2128a. That is, when the wafer backside plate 2114 is initially placed in its position (i.e., over the chuck top plate 2110) the wafer backside pin 2129 is inserted into the height adjusting slot 2128 at the point 2128c defined at the height A. It must be noted that although in this implementation only one wafer height adjusting slot 2128a is shown, a matching wafer height adjusting slot 2128a is defined on the sleeve 2128 in a substantially opposite and symmetrical location.

In one embodiment, the mechanism of the wafer backside plate 2114 can be described as follows: Initially, the wafer backside plate 2114 is in the down position (i.e., the wafer backside plate 2114 is placed on top of the chuck top plate 2110). Then, the chuck assembly and the wafer backside plate 2114 start rotating at low RPMs. As the RPMs of the chuck assembly increase so as to reach a drying speed, the centrifugal force created by the rotation of the chuck assembly causes the rotating wafer backside plate 2114 to rise from its initial down position. While the rotating wafer backside plate 2114 is rising from the down position (i.e., position C) to assume the up position (i.e., position D), the wafer backside pin 2129 is lead through the height adjusting slot 2128a from the initial height A to the height B. Once the wafer backside plate 2114 rises to the up position, at that point, the top surface of the wafer backside plate 2114 will almost be in the same plane as the under-surface of the wafer. Having the top surface of the wafer backside plate 2114 in the same plane as the wafer under-surface 118a is advantageous, as it reduces turbulent airflows under and over the wafer. An additional benefit is that it assists in reducing recontamination of the under-surface of the wafer 118 during drying operations.

However, as the chuck assembly decreases, the backside pin 2129 of the wafer backside rises back through the height adjusting slot 2128a from the height B to the height A so as to assume the down position. Having a wafer backside plate 2114 configured to be move from t he up position on to a down position is between the wafer backside plate 2114 and the wafer 118 allows the end effector to approach the wafer process plane so as to load/unload a processed wafer.

Although in these embodiments the height adjusting slots 2128a have been defined on the sleeve 2128 and the wafer backside pins have been defined on the wafer backside 2114, it must be understood by one of ordinary skill in the art that in a different embodiment, the positions of the wafer backside pins 2129 and the height adjusting slots 2128a may be switched. That is, pins may be defined on the sleeve 2128 and height adjusting slots may be defined on the wafer backside plate 2114 so long as collectively, the pins and the height adjusting slots can act as wafer backside plate motion stoppers. Furthermore, it must be noted that in the embodiments wherein the height adjusting slots 2128a are defined on the sleeve 2128, the sleeve 2128 may be constructed from a material flexible enough to endure the movement of the pins 2129 through the height adjusting slots 2128a.

Although the foregoing invention has been described in some detail for purposes of clarity of understanding, it will be apparent that certain changes and modifications may be practiced within the scope of the appended claims. For example, embodiments described herein have been primarily directed toward spinning, rinsing, and drying (SRD) wafers; however, it should be understood that the SRD module of the present invention is well suited for spin rinsing of any type of substrate. Furthermore, it should be understood that the SRD module of the present invention is well suited for spin rinsing of any size wafer or substrate, such as hard disks. Accordingly, the present embodiments are to be considered as illustrative and not restrictive, and the invention is not to be limited to the details given herein, but may be modified within the scope and equivalents of the appended claims.

What is claimed is:

1. An apparatus for preparing a wafer, comprising:
   a wafer backside plate positioned under a wafer location, the wafer backside plate having a top surface and a back surface, the wafer backside plate including a cylindrical edge lip that defines a central aperture, the cylindrical edge lip including a pin;
   a central shaft fitting within the central aperture, the central shaft including a height adjustment slot configured to engage the pin, the pin being capable of sliding within the height adjustment slot, the wafer backside plate being configured to automatically slide to a second position by centrifugal force when the wafer backside plate and the shaft are spinning during rotational wafer processing and a first position when the wafer backside plate and the shaft stop, the wafer backside plate sliding independent of non-rotational movement of the shaft, and wherein a gap defined between the top surface of the wafer backside plate and the wafer location is less when in the second position than when in the first position.

2. An apparatus of claim 1, wherein the height adjustment slot includes,
   an initial position; and
   a last position,
   wherein the pin is movably disposed within the height adjustment slot such that the pin slides from the initial position in the height adjustment slot to the last position in the height adjustment slot during rotational wafer processing.

3. An apparatus of claim 1, wherein the height adjustment slot includes,
   an initial position; and
   a last position,
   wherein the pin is movably disposed within the height adjustment slot such that the pin slides from the last position in the height adjustment slot to the initial position in the height adjustment slot when completing rotational wafer processing.

4. An apparatus for preparing a wafer, comprising:
   a chuck having a plurality of grippers for holding the wafer;
   a wafer backside plate positioned under a wafer location, the wafer backside plate having a top surface and a back surface, the wafer backside plate including a cylindrical edge lip that defines a central aperture, the cylindrical edge lip being defined on the back surface, the cylindrical edge lip including a pin;
   a shaft connected to a central portion of the chuck, the shaft including a height adjustment slot, the height adjustment slot configured to receive and engage the pin, the wafer backside plate being configured to automatically slide to a second position by centrifugal force when the chuck, the wafer backside plate, and the shaft are spinning during rotational wafer processing and to a first position when the chuck, the wafer backside plate, and the shaft stop spinning upon completing rotational wafer processing, the backside plate sliding independent of non-rotational movement of the shaft, and wherein a gap defined between the top surface of the wafer backside plate and the wafer location is less when in the second position than when in the first position.

5. An apparatus of claim 4, wherein the height adjustment slot includes,
   an initial position; and
   a last position,
   wherein the pin is movably disposed within the height adjustment slot such that the pin slides from the initial position in the height adjustment slot to the last position in the height adjustment slot during rotational wafer processing.

6. An apparatus of claim 4, wherein the height adjustment slot includes,
   an initial position; and
   a last position,
   wherein the pin is movably disposed within the height adjustment slot such that the pin slides from the last position in the height adjustment slot to the initial position in the height adjustment slot when completing rotational wafer processing.

7. An apparatus for spinning, rinsing and drying a wafer, comprising:
- a chuck having a plurality of wafer holders for holding the wafer during the spinning, rinsing and drying;
- a wafer backside plate having a disk-like top surface that mirrors the wafer being held by the holders above the wafer backside plate, the wafer backside plate including a cylindrical edge lip at a center, the edge lip having an inner surface and an outer surface, the inner surface of the edge lip defining a central aperture, the outer surface of the edge lip including a pin;
- a shaft connected to a central portion of the chuck, the shaft including a height adjustment slot, the shaft configured to receive and engage the pin included in the outer surface of the edge lip of the backside plate, the wafer backside plate being configured to automatically slide to a second position when the chuck, the wafer backside plate, and the shaft are spinning during rotational wafer processing by centrifugal force, and to a first position when the chuck, the wafer backside plate, and the shaft stop, and wherein a gap defined between the top surface of the wafer backside plate and the wafer is less when in the second position than when in the first position.

8. An apparatus of claim 7, wherein the height adjustment slot includes,
- an initial position; and
- a last position,
- wherein the pin is movably disposed within the height adjustment slot such that the pin slides from the initial position in the height adjustment slot to the last position in the height adjustment slot during rotational wafer processing.

9. An apparatus of claim 7, wherein the height adjustment slot includes,
- an initial position; and
- a last position,
- wherein the pin is movably disposed within the height adjustment slot such that the pin slides from the last position in the height adjustment slot to the initial position in the height adjustment slot when completing rotational wafer processing.

10. An apparatus for preparing a wafer, comprising:
- a chuck having a plurality of wafer holders for holding the wafer during preparation;
- a wafer backside plate positioned under a wafer location, the wafer backside plate having a top surface and a back surface, the wafer backside plate including a cylindrical edge lip that defines a central aperture, the cylindrical edge lip including a pin;
- a central shaft fitting within the central aperture, the shaft including a height adjustment slot that is configured to engage the pin, the pin configured to slide within the height adjustment slot, the wafer backside plate being configured to automatically slide to an up position along the height adjustment slot by centrifugal force when the wafer backside plate and the shaft are spinning during rotational wafer processing and a down position along the height adjustment slot when the wafer backside plate and the shaft stop spinning, and wherein a gap defined between the top surface of the wafer backside plate and the wafer location is less when in the up position than when in the down position.

11. An apparatus for preparing a wafer, comprising:
- a wafer backside plate positioned under a wafer location, the wafer backside plate having a top surface and a back surface, the wafer backside plate including a cylindrical edge lip that defines a central aperture, the cylindrical edge lip of the wafer backside plate including a pin;
- a central shaft fitting within the central aperture, the shaft including a height adjustment slot that is configured to engage the pin, the pin configured to slide within the height adjustment slot, the wafer backside plate being configured to automatically slide to an up position by centrifugal force when the wafer backside plate and the shaft are spinning during rotational wafer processing and a down position when the wafer backside plate and the shaft stop spinning, and wherein a gap defined between the top surface of the wafer backside plate and the wafer location is less when in the up position than when in the down position.

* * * * *